(12) United States Patent
Iwaki et al.

(10) Patent No.: US 9,374,935 B2
(45) Date of Patent: Jun. 21, 2016

(54) MANUFACTURE WORK MACHINE

(75) Inventors: Noriaki Iwaki, Hekiman (JP);
Kazuyoshi Nagato, Toyoake (JP);
Masaki Kato, Toyota (JP); Hideaki Nomura, Toyota (JP); Shinji Ichino, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 354 days.

(21) Appl. No.: 13/643,347

(22) PCT Filed: Mar. 29, 2011

(86) PCT No.: PCT/JP2011/057816
§ 371 (c)(1),
(2), (4) Date: Oct. 31, 2012

(87) PCT Pub. No.: WO2011/135962
PCT Pub. Date: Nov. 3, 2011

(65) Prior Publication Data
US 2013/0047392 A1       Feb. 28, 2013

(30) Foreign Application Priority Data

| Apr. 29, 2010 | (JP) | 2010-104661 |
| May 28, 2010 | (JP) | 2010-122483 |
| May 28, 2010 | (JP) | 2010-122484 |
| Jun. 1, 2010 | (JP) | 2010-125545 |

(51) Int. Cl.
*H05K 13/04*        (2006.01)

(52) U.S. Cl.
CPC ......... *H05K 13/04* (2013.01); *Y10T 29/51* (2015.01)

(58) Field of Classification Search
CPC .............. H01L 21/67132; H01L 21/67; H01L 21/67144; H01L 21/6838; H01L 21/67259; H05K 13/04; H05K 13/0408; H05K 13/0417; H05K 13/0413; H05K 13/0452; H05K 13/08

USPC .......... 29/700, 720, 739, 740, 743, 832, 833, 29/834, 830, 464
See application file for complete search history.

(56) References Cited

U.S. PATENT DOCUMENTS 4,790,069 A * 12/1988 Maruyama et al. ............. 29/832
5,960,534 A * 10/1999 Yazawa et al. ................. 29/743
(Continued)

FOREIGN PATENT DOCUMENTS

| CN | 1714611 A | 12/2005 |
| CN | 1799299 A | 7/2006 |
(Continued)

OTHER PUBLICATIONS

May 17, 2011 International Search Report issued in International Patent Application No. PCT/JP2011/057812.
(Continued)

*Primary Examiner* — David Bryant
*Assistant Examiner* — Jun Yoo
(74) *Attorney, Agent, or Firm* — Oliff PLC

(57) ABSTRACT

A manufacture work machine for performing a manufacture work, including a plurality of work-element performing apparatuses each configured to perform one of a plurality of work elements that constitute the manufacture work, wherein the plurality of work-element performing apparatuses include a plurality of work head devices and wherein the plurality of work head devices include a first work head device and a second work head device which are mutually different in kind of a work to be performed.

7 Claims, 25 Drawing Sheets

(56) References Cited

U.S. PATENT DOCUMENTS

| | | | |
|---|---|---|---|
| 6,161,277 A * | 12/2000 | Asai et al. | 29/740 |
| 6,708,385 B1 | 3/2004 | Lemelson | |
| 6,718,629 B1 | 4/2004 | Stanzl | |
| 6,876,896 B1 | 4/2005 | Ortiz et al. | |
| 6,948,232 B1 * | 9/2005 | Yazawa et al. | 29/740 |
| 2003/0093254 A1 | 5/2003 | Frankel et al. | |
| 2003/0135991 A1 | 7/2003 | Nagao et al. | |
| 2004/0117983 A1 | 6/2004 | Beck et al. | |
| 2006/0017765 A1 | 1/2006 | Sato | |
| 2006/0085973 A1 | 4/2006 | Kodama et al. | |
| 2006/0131156 A1 | 6/2006 | Voelckers | |
| 2006/0179645 A1 | 8/2006 | Chikuma et al. | |
| 2006/0207090 A1 | 9/2006 | Kawada | |
| 2006/0224265 A1 | 10/2006 | Nakayama et al. | |
| 2007/0089113 A1 | 4/2007 | Kobayashi | |
| 2007/0296826 A1 | 12/2007 | Kimura | |
| 2008/0158596 A1 | 7/2008 | Kadota | |
| 2010/0131078 A1 | 5/2010 | Brown et al. | |
| 2010/0131081 A1 | 5/2010 | Brown et al. | |
| 2011/0058107 A1 | 3/2011 | Sun et al. | |
| 2011/0156898 A1 | 6/2011 | Taillefer et al. | |

FOREIGN PATENT DOCUMENTS

| | | |
|---|---|---|
| CN | 1835676 A | 9/2006 |
| CN | 101094322 A | 12/2007 |
| DE | 4016033 A1 | 11/1991 |
| JP | S58-175894 A | 10/1983 |
| JP | A-61-39134 | 2/1986 |
| JP | H02-288393 A | 11/1990 |
| JP | A-3-167895 | 7/1991 |
| JP | A-4-172504 | 6/1992 |
| JP | A-5-46631 | 2/1993 |
| JP | H06-67709 A | 3/1994 |
| JP | A-6-95729 | 4/1994 |
| JP | H06-318104 A | 11/1994 |
| JP | H07-060577 | 3/1995 |
| JP | A-10-105494 | 4/1998 |
| JP | H11-039018 A | 2/1999 |
| JP | A-11-204998 | 7/1999 |
| JP | H11-179682 A | 7/1999 |
| JP | A-2000-035809 | 2/2000 |
| JP | A-2001-255912 | 9/2001 |
| JP | A-2001-320159 | 11/2001 |
| JP | A-2003-5809 | 1/2003 |
| JP | 2003-086654 A | 3/2003 |
| JP | 2004-006938 A | 1/2004 |
| JP | A-2004-6512 | 1/2004 |
| JP | 2004-506319 A | 2/2004 |
| JP | A-2004-104075 | 4/2004 |
| JP | 2004-221518 A | 8/2004 |
| JP | A-2004-265946 | 9/2004 |
| JP | A-2004-280305 | 10/2004 |
| JP | A-2004-319662 | 11/2004 |
| JP | A-2006-261325 | 9/2006 |
| JP | A-2007-98553 | 4/2007 |
| JP | 2007-129130 A | 5/2007 |
| JP | A-2007-129130 | 5/2007 |
| JP | A-2007-158213 | 6/2007 |
| JP | A-2008-60250 | 3/2008 |
| JP | A-2008-153707 | 7/2008 |
| JP | 2008-229738 A | 10/2008 |
| JP | 2008-270322 A | 11/2008 |
| JP | 2009-105351 A | 5/2009 |
| JP | A-2009-123895 | 6/2009 |
| JP | 2009-172689 A | 8/2009 |
| WO | 2004/047512 A1 | 6/2004 |

OTHER PUBLICATIONS

Dec. 10, 2012 International Preliminary Report on Patentability issued in International Patent Application No. PCT/JP2011/057812 (with translation).
Dec. 20, 2012 International Preliminary Report on Patentability issued in Patent Application No. PCT/JP2011/057815.
May 17, 2011 International Search Report issued in Patent Application No. PCT/JP2011/057815.
Apr. 12, 2011 International Search Report issued in International Application No. PCT/JP2011/056060 (with translation).
Nov. 19, 2013 Office Action issued in Japanese Application No. 2010-122484 (with English translation).
Nov. 19, 2013 Office Action issued in Japanese Application No. 2010-125545 (with English translation).
Nov. 12, 2013 Office Action issued in Japanese Application No. 2010-104661 (with English translation).
U.S. Appl. No. 13/641,637 in the name of Kodama et al., filed Oct. 16, 2012.
U.S. Appl. No. 13/643,437 in the name of Kodama et al., filed Oct. 31, 2012.
U.S. Appl. No. 13/643,398 in the name of Kodama et al., filed Oct. 31, 2012.
Oct. 10, 2014 Office Action issued in Chinese Application No. 201180021073.3.
International Search Report issued in International Patent Application PCT/JP2011/057816 dated May 17, 2011.
Written Opinion issued in International Patent Application PCT/JP2011/057816 dated May 17, 2011.
International Preliminary Report on Patentability issued in International Patent Application PCT/JP2011/057816 dated Dec. 10, 2012.
Office Action issued in Japanese Patent Application No. 2010-122483 dated Jan. 21, 2014 (with translation).
Office Action issued in Japanese Patent Application No. 2010-104661 dated Jan. 28, 2014 (with translation).
International Preliminary Report on Patentability issued in International Application No. PCT/JP2011/056060 on Dec. 10, 2012.
Office Action issued in Japanese Patent Application No. 2010-122484 dated Feb. 18, 2014 (with translation).
Office Action issued in Chinese Application No. 201180021302.1 dated Aug. 5, 2014 (with translation).
Report of Reconsideration by Examiner before Appeal issued in Japanese Application No. 2010-122484 dated Sep. 3, 2014 (with translation).
Jul. 28, 2014 Office Action issued in Chinese Application No. 201180021080.3 (with translation).
Aug. 26, 2014 Office Action issued in Japanese Application No. 2010-122483 (with translation).
Office Action issued in Japanese Patent Application No. 2010-104661 dated Jun. 24, 2014 (with translation).
Dec. 16, 2014 Office Action issued in Japanese Patent Application No. JP2014-008009.
Jan. 23, 2015 Office Action issued in U.S. Appl. No. 13/641,637.
Feb. 24, 2015 Office Action issued in U.S. Appl. No. 13/643,437.
Dec. 24, 2014 Office Action issued in Japanese Application No. 2014-083338.
Jan. 6, 2015 Office Action issued in Japanese Application No. 2014-055980.
Nov. 18, 2014 Office Action issued in Japanese Application No. 2014-007549.
Oct. 20, 2014 Office Action issued in Chinese Application No. 201180021362.3.
Mar. 3, 2015 Office Action issued in Japanese Patent Application No. 2014-055981.
Mar. 24, 2015 Office Action issued in Japanese Patent Application No. 2014-090948.
May 8, 2015 Office Action issued in U.S. Appl. No. 13/643,398.
Sep. 1, 2015 Office Action issued in Japanese Patent Application No. 2014-212430.
Jun. 30, 2015 Office Action issued in Japanese Patent Application No. 2014-083338.
Aug. 11, 2015 Office Action issued in U.S. Appl. No. 13/643,437.
Nov. 10, 2015 Office Action cited in Japanese Patent Application No. 2014-090948.
Dec. 2, 2015 Office Action issued in U.S. Appl. No. 13/643,398.
Jan. 29, 2016 Office Action Issued in U.S. Appl. No. 13/643,437.
Mar. 29, 2016 Office Action cited in Japanese Patent Application No. 2014-212430.

* cited by examiner

FIG.13

| MOTION COMMAND No. | MOTION COMMAND |
|---|---|
| (i) | CONVEYOR: CONVEYANCE OF BASE MEMBER INTO MANUFACTURE WORK MACHINE |
| (ii) | HEAD MOVING DEVICE: MOVEMENT OF HEAD CAMERA ABOVE BASE MEMBER |
| (iii) | HEAD CAMERA: IMAGE TAKING OF ENTIRETY OF BASE MEMBER |
| (iv) | COMPONENT SUPPLIER: SUPPLY OF MOUNT COMPONENT |
| (v) | HEAD MOVING DEVICE: MOVEMENT OF HEAD CAMERA ABOVE MOUNT POSITION |
| (vi) | HEAD CAMERA: IMAGE TAKING OF MOUNT POSITION |
| (vii) | HEAD MOVING DEVICE: MOVEMENT OF DISPENSER HEAD TO MOUNT POSITION |
| (viii) | DISPENSER HEAD: EJECTION OF ADHESIVE |
| (ix) | HEAD MOVING DEVICE: MOVEMENT OF COMPONENT HOLDING HEAD TO COMPONENT SUPPLY POSITION |
| (x) | COMPONENT HOLDING HEAD: HOLDING OF MOUNT COMPONENT |
| (xi) | HEAD MOVING DEVICE: MOVEMENT OF COMPONENT HOLDING HEAD ABOVE BASE CAMERA |
| (xii) | BASE CAMERA: IMAGE TAKING OF MOUNT COMPONENT |
| (xiii) | HEAD MOVING DEVICE: MOVEMENT OF COMPONENT HOLDING HEAD TO MOUNT POSITION |
| (xiv) | COMPONENT HOLDING HEAD: MOUNTING OF MOUNT COMPONENT |
| ⋮ | ⋮ REPEATED EXECUTION OF (v)-(xiv) |
|  | CONVEYOR: CONVEYANCE OF ASSEMBLED ARTICLE OUT OF MANUFACTURE WORK MACHINE |

MANUFACTURE WORK MACHINE

TECHNICAL FIELD

The present invention relates to a manufacture work machine configured to perform a manufacture work.

BACKGROUND ART

As an assembling work machine configured to perform an assembling work of an electric circuit as one kind of a manufacture work, there is known an assembling work machine described in the following Patent Literature, for instance. Such an assembling work machine is called a component mounting machine which is configured to perform a work of mounting, on a circuit substrate as one component, a circuit component as another component and which is constituted by a plurality of work-element performing apparatuses including a conveyor, a component supplier, and a mounting head corresponding to a plurality of work elements such as conveyance of the circuit substrate, supplying of the circuit component, and mounting of the circuit component onto the circuit substrate.

CITATION LIST

Patent Literature

[Patent Literature 1] JP-A-2004-104075

SUMMARY OF INVENTION

Technical Problem

The above-described circuit-component mounting machine can only perform a single kind of work such as mounting of the circuit component onto the circuit substrate and lacks versatility. For instance, versatility of the manufacture work machine can be enhanced by extending a target of the manufacture to components other than the electric circuit, by permitting the manufacture work machine to perform plural kinds of works, etc. The present invention has been made in view of the situations. It is therefore an object of the invention to provide a manufacture work machine with enhanced versatility.

Solution to Problem

To solve the problem described above, a manufacture work machine according to the present invention is characterized by including, each as a work-element performing apparatus, a plurality of work head devices which are mutually different in kind of a work to be performed.

Advantageous Effects of Invention

The manufacture work machine according to the present invention includes a plurality of work head devices which are mutually different in kind of a work to be performed, so that plural kinds of works can be performed. Accordingly, a manufacture work machine with enhanced versatility can be realized.

Forms of Invention

There will be explained various forms of an invention which is considered claimable (hereinafter referred to as "claimable invention" where appropriate). Each of the forms depends from the other form or forms, where appropriate. This is for easier understanding of the claimable invention, and it is to be understood that combinations of constituent elements that constitute the invention are not limited to those described in the following forms. That is, it is to be understood that the claimable invention shall be construed in the light of the following description of various forms and embodiments. It is to be further understood that any form in which one or more constituent elements is/are added to or deleted from any one of the following forms may be considered as one form of the claimable invention.

<Basic Structure>

There will be hereinafter explained some forms relating to a basic structure.

(1) A manufacture work machine for performing a manufacture work, comprising:

a plurality of work-element performing apparatuses each configured to perform one of a plurality of work elements that constitute the manufacture work.

The "manufacture work" performed by the present manufacture work machine, namely, a target work of the present manufacture work machine, is not particularly limited, but may include an assembling work of assembling a plurality of components (parts) into an assembled article and various works in which certain processing, treatment or the like is performed on a work object (which is a concept that includes "component (part)", "assembled article", "object to be processed or treated", etc.,). More specifically, as the work to perform certain processing, a work, such as a press work, in which the work object is deformed, a work, such as a cut-off work, in which a part of the work object is cut off, and a work, such as a cutting work, in which the work object is shaped, may be the target work, for instance. As the work to perform a certain treatment, a surface modification work in which a surface of the work object is modified by laser, plasma or the like, a coating work in which an adhesive, a coloring agent or the like is applied to the work object, a heat treatment work in which the work object is heated, dried, cooled, etc., by hot air, cool air, etc., a surface finishing work such as grinding, a work of fixing, etc., by screwing, etc., other component mounted onto one component, and a work of irradiating the work object with light, ultraviolet light, electromagnetic wave, etc., for the purpose of fixation, curing, etc., may be the target work, for instance. Further, an inspection work of inspecting work results of the assembling work and the works in which certain processing, treatment or the like is performed may be the target work.

The "work element" means one of a movement, rotation, a posture change, a treatment, processing and the like, to be performed on the work object, for instance. One manufacture work is performed by coordination of those work elements. The kind and the number of the work elements and the manner of coordination vary depending upon the target work. The "work-element performing apparatus" is an apparatus for performing one work element and may be considered as an apparatus having a single function in accordance with the work element, for instance. More specifically, where the target work is the assembling work, for instance, each of the following (a)-(d) is incorporated as the work-element performing apparatus into the manufacture work machine: (a) a conveyor configured to perform conveyance for conveying one component from an outside of the manufacture work machine and for conveying the assembled article out of the manufacture work machine; (b) a component supplier configured to supply another component; (c) a component holding head device (which is one kind of a "work head device"

and is referred to as a "carry head") configured to perform holding of another component supplied by the component supplier for attachment to the one component; and (d) a head moving device configured to move the component holding head for moving the component held by the component holding head. In the assembling work or in the inspection work for inspecting the result of the assembling work, an image taking device such as a camera for taking an image of the component or the assembled article to recognize the position and the posture thereof, the assembling accuracy, etc., may be the work-element performing apparatus configured to perform image taking processing as the work element. In the assembling work, an adhesive applying device for applying an adhesive to at least one of the two components for bonding thereof may be the work-element performing apparatus configured to perform adhesive application as the work element. Further, the device configured to perform certain processing, or treatment, etc., such as laser processing or plasma processing may be the work-element performing apparatus in the manufacture work in which the processing or treatment is performed.

(2) The manufacture work machine according to the form (1), comprising a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses.

According to this form, it is possible to flexibly deal with changes of the target to be manufactured simply by changing a matter of each motion command transmitted from the central control device by means of the central control device.

(3) The manufacture work machine according to the form (1) or (2), wherein each of the plurality of work-element performing apparatuses includes an individual control device configured to control an operation thereof.

According to this form, each work-element performing apparatus is controlled by the individual control device which corresponds thereto. In short, each work-element performing apparatus is made intelligent. The manufacture work machine may include a work-element performing apparatus which does not have the individual control device. In this instance, only the work-element performing apparatus which includes the individual control device corresponds to the work-element performing apparatus according to this form.

(4) The manufacture work machine according to the form (3), wherein each of the plurality of work-element performing apparatuses includes at least one operating device for performing a work element corresponding to said each of the plurality of work-element performing apparatuses, and wherein each of the plurality of work-element performing apparatuses is configured such that the individual control device of said each of the plurality of work-element performing apparatuses controls the at least one operating device.

The "operating device" in this form may be one controllable operating main element in one work-element performing apparatus or a drive source, such as a motor, for the operating main body, for instance. Typically, in the component holding head explained above, a device for holding is the operating device. Where the work-element performing apparatus is a conveying apparatus, for instance, a conveying device such as a conveyor is one operating device, and a fixing device for fixing an object to be conveyed in association with conveyance is also the operating device where the conveying apparatus includes the fixing device. Where an XY-type or XYZ-type head moving device which will be explained is the work-element performing apparatus, each of linear-type moving devices, which bear a movement in an X direction, a movement in a Y direction, and a movement in a Z direction, respectively, is the operating device. It is noted that the operating device is not limited to an operating device functioning as an actuator. Where a plasma treatment apparatus, the laser treatment apparatus or the like is the work-element performing apparatus, a plasma generator, a laser generator or the like may be the operating device. Where the image taking device is the work-element performing apparatus, an illuminator or the like is the operating device, in addition to the image taking device such as a camera. Moreover, the operating main element configured to perform certain processing or treatment, etc., indicated above may be the operating device. Where the work-element performing apparatus includes a plurality of operating devices, the plurality of operating devices are controlled by one individual control device, so that the work-element performing apparatus is made intelligent.

(5) The manufacture work machine according to the form (4), comprising a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses, wherein the individual control device is configured to recognize a matter of the motion command transmitted from the central control device and is configured to control an operation of each of the at least one operating device so as to permit one of the plurality of work-element performing apparatuses to which the individual control device belongs to perform one motion corresponding to the motion command.

In this form, the individual control device understands a matter of the motion command from the central control device and controls an operation of an appropriate operating device, and the work-element performing apparatus according to this form is a considerably intelligent apparatus. Where replacement or exchange of the work-element performing apparatus is carried out depending upon the manufacture work, it is possible to deal with the replacement or exchange of the work-element performing apparatus simply by changing the matter of the motion command without making any change to the central control device. Here, the replacement or exchange of the work-element performing apparatus is a concept which includes both of detachment and attachment of the apparatus from and to the manufacture work machine.

(6) The manufacture work machine according to any one of the forms (3)-(5), comprising a central control device configured to control the plurality of work-element performing apparatuses in a centralized manner, such that a plurality of motion commands are sequentially transmitted, each of the plurality of motion commands being a command for one motion to be performed by one of the plurality of work-element performing apparatuses, wherein the central control device includes a central interface section for transmitting the motion command according to one protocol to each of the plurality of work-element performing apparatuses, and wherein the individual control device of each of the plurality of work-element performing apparatuses includes an individual interface section for receiving, according to the one protocol, the motion command transmitted from the central control device.

In this form, to put it briefly, interfaces of the respective individual control devices of the work-element performing apparatuses are made identical to each other. According to this form, even where the work-element performing apparatus is replaced, it is possible to easily deal with the replacement.

(7) The manufacture work machine according to any one of the forms (3)-(6), wherein at least one of the plurality of work-element performing apparatuses is constructed such that the individual control device is incorporated into a portion that operates for performing the one of the plurality of work elements, so as to constitute a unit.

The work-element performing apparatus according to this form may be considered as an apparatus in which a main body, namely, a portion having a mechanism which operates for the work and the individual control device are unified. The work-element performing apparatus which constitutes a unit described above can be easily replaced or exchanged.

(8) The manufacture work machine according to any one of the forms (1)-(7), comprising a base, wherein at least one of the plurality of work-element performing apparatuses is configured to be attachable to and detachable from one of the base and another one of the plurality of work-element performing apparatuses except itself.

It is possible to easily replace or exchange the work-element performing apparatus where the work-element performing apparatus is configured to be attachable and detachable. Here, it is preferable to employ a mechanism that allows the work-element performing apparatus to be attached and detached with one-touch action. In other words, it is preferable to employ a mechanism that allows fixation of the apparatus and release of the fixation by a single operation of a suitable operating member.

(9) The manufacture work machine according to any one of the forms (1)-(8), wherein at least one of the plurality of work-element performing apparatuses is configured to be exchangeable with another work-element performing apparatus.

Where the work-element performing apparatus is configured to be exchangeable as explained above, the manufacture work machine can be used as a general-purpose machine. In other words, the manufacture work machine can deal with various sorts of works by including appropriate work-element performing apparatuses in accordance with the manufacture work to be performed.

(10) The manufacture work machine according to the form (9), further comprising said another work-element performing apparatus which is exchangeable with the at least one of the plurality of work-element performing apparatuses.

In the manufacture work machine according to this form, not all the work-element performing apparatuses are disposed within the main body of the manufacture work machine, but another work-element performing apparatus which is exchangeable with the at least one of the plurality of work-element performing apparatuses is included in an independent state in the manufacture work machine, together with the main body and the work-element performing apparatuses disposed in the main body, so as to constitute one set.

(11) The manufacture work machine according to any one of the forms (1)-(10), which is an assembling work machine configured to perform, as the manufacture work, an assembling work of assembling a plurality of components into an assembled article.

(12) The manufacture work machine according to the form (11), which is configured to perform, as at least a part of the assembling work, a work of mounting, onto a first component as one of the plurality of components, a second component as another one of the plurality of components.

(13) The manufacture work machine according to the form (12), wherein the plurality of work-element performing apparatuses include a work head device configured to perform, as one of the plurality of work elements, a work necessary for mounting the second component onto the first component or a work to be performed on an article in which the second component has been mounted onto the first component.

(14) The manufacture work machine according to the form (12) or (13), wherein the plurality of work-element performing apparatuses include a conveyor configured to perform, as one of the plurality of work elements, conveyance of at least one of the first component and the assembled article.

(15) The manufacture work machine according to any one of the forms (12)-(14), wherein the plurality of work-element performing apparatuses include a component supplier configured to perform, as one of the plurality of work elements, supplying of the second component.

In each of the above five forms, the manufacture work machine functions as an assembling work machine. The above-indicated "work necessary for mounting the second component onto the first component" relating to the work head device may be a "main work" in a work of mounting the second component onto the first component (hereinafter referred to as the "mounting work" where appropriate) or may be an "auxiliary work". The "main work" includes holding of the second component performed for the mounting, more specifically, a work of holding the second component for conveying the supplied second component to a position at which the first component is present, a work of fixing by screwing the second component into the first component, etc., for instance. Here, the work head device configured to perform the holding of the second component may be referred to as a component holding head. On the other hand, the "auxiliary work" includes taking of an image of the first component for recognition of a position, an orientation, etc., of the first component which is positioned in place, a work to be performed prior to the mounting of the second component onto the first component, such as application of an adhesive, a treatment agent, etc., to at least one of the first component and the second component. Here, the work head device configured to perform the image taking may be referred to as an image taking head. An applying head as the work head device configured to apply the adhesive, etc., is one sort of an application head. Further, the "work to be performed on an article in which the second component has been mounted onto the first component" includes an auxiliary work in the assembling work, such as taking an image of the assembled article for recognition of assembling accuracy of the assembled article, etc., for instance.

<Work Head Device>

There will be hereinafter explained some forms relating to a work head device.

(21) The manufacture work machine according to any one of the forms (1)-(15), wherein the plurality of work-element performing apparatuses include a work head device.

The "work head device" is a work-element performing apparatus that plays a main role in the manufacture work and may be considered as an apparatus for performing a certain operation or a certain treatment on the work object generally from above the work object or from the side of the work object. It is possible to employ various work head devices in accordance with the target work of the manufacture work machine. Since the work head device to be employable in the assembling work has been explained above, its explanation is dispensed with. Even in the manufacture work machine configured to perform a work other than the assembling work, each of the above-indicated component holding head, applying head, image taking head, etc., may be the work head device in the manufacture work machine. Further, a laser head including the laser generator, a plasma head including the plasma generator, or the like may be the work head device in the manufacture work machine. Here, a component moving head configured to move the component, a component holding head configured to hold the component for the movement of the component or the like may be referred to as a carry head. Further, the above-indicated work head device configured to perform certain processing or treatment, such as the applying head, the image taking head, the laser head, or the plasma head, may be referred to as a process head.

(22) The manufacture work machine according to the form (21), wherein the work head device is exchangeable with another work head device.

(23) The manufacture work machine according to the form (22), further comprising said another work head device which is exchangeable with the work head device.

The above two forms largely contribute to enhancement of versatility of the manufacture work machine.

(24) The manufacture work machine according to any one of the forms (21)-(23), wherein the work head device includes: a main device which functions as a main working element in a work to be performed by the work head device; and a movement device configured to move the main device.

In this form, the work head device includes a plurality of operating devices. The "main device" in this form is a device that plays a main role in the work element to be performed. Further "to move the main device" as the function of the "movement device" means not only "movement" in a narrow sense, but also "rotating motion", "pivoting motion", "vibrating motion", "swinging motion", etc. In the component holding head, for instance, a component holding device (e.g., a rod-like member) having, at its distal end, a suction nozzle, a chuck, a clamp or the like corresponds to the main device while an actuator configured to move the component holding device in an extension direction of the axis of the device, an actuator configured to rotate the device about the axis, etc., corresponds to the movement device.

<Plurality of Work Head Devices>

There will be hereinafter explained some forms relating to a manufacture work machine equipped with a plurality of work head devices.

(31) The manufacture work machine according to any one of the forms (21)-(24), wherein the plurality of work-element performing apparatuses include a plurality of work head devices each as the work head device.

Where the manufacture work machine includes a plurality of work head devices, throughput, versatility, etc., of the manufacture work machine can be enhanced. Where the manufacture work machine includes a plurality of work head devices which are mutually the same, the manufacture work machine ensures increased productivity. Further, where the manufacture work machine includes a plurality of the same kind of work head devices, variety of the work object that can be handled is increased.

(32) The manufacture work machine according to the form (31), wherein the plurality of work head devices include a first work head device and a second work head device which are mutually different in kind of a work to be performed.

In this form, the manufacture work machine includes a plural kinds of work head devices, namely, a plurality of different work head devices which are mutually different in function. In this form, "mutually different in kind of the work to be performed" means that the work element performed by the first work head device and the work element performed by the second work head device are mutually different. For instance, the component holding head performs holding of the component for conveyance and movement, the applying head performs application of the adhesive or the like, the image taking head performs image taking of the target object, as the target work element. In this case, these work head devices are mutually different in kind to the work to be performed. The manufacture work machine which includes the work head devices that perform mutually different work elements can perform a complex manufacture work, namely, a manufacture work composed of mutually different kinds of works.

(33) The manufacture work machine according to the form (32), wherein the first work head device functions as a main head device configured to perform a main work in the manufacture work as one of the plurality of work elements while the second work head device functions as an auxiliary head device configured to perform an auxiliary work for the main work as another one of the plurality of work elements.

The "main work" in this form means a central or core work element in the manufacture work to be performed by the manufacture work machine, and the "auxiliary work" may be considered as a work element to be performed in association with the main work. For instance, there is included, in this form, a form in which the work performed by the main head device and the work performed by the auxiliary head device constitute a series of works or a cooperative work (which is a concept including a collaborative work, a synchronous work, a coordinative work, etc.). Various works may be the main work and the auxiliary work depending upon the target work. In the assembling work machine configured to perform the assembling work as the target work, the component holding head, etc., functions as the main head device while the applying head, the image taking head, etc., functions as the auxiliary head device as explained above, for instance.

Where the manufacture work machine is configured to perform a work of incorporating, into one component, another component and it is required to support the one component and to fix the position of the one component in the work, a head configured to perform screwing, press-fitting, etc., of another component functions as the main head device while a head configured to perform supporting and position fixing of another component functions as the auxiliary head device. Where it is required to support the work object, to fix the position of the work object, and to press-fitting the work object in the work of performing certain processing or treatment such as the laser processing, a head configured to perform processing or treatment on the work object functions as the main head device while a head configured to perform supporting, position fixing, press-fitting of the work object functions as the auxiliary head device. Such an incorporation work, the processing or the treatment, etc., is one example of the cooperative work performed by two work head devices in which the two work head devices cooperate with each other as if a human handles one work object with both hands.

(34) The manufacture work machine according to the form (32) or (33), which is an assembling work machine configured to perform, as the manufacture work, an assembling work of assembling a plurality of components into an assembled article and which is configured to perform, as at least a part of the assembling work, a work of mounting, onto a first component as one of the plurality of components, a second component as another one of the plurality of components, wherein the first work head device is configured to perform holding of the second component, as a work necessary for mounting the second component onto the first component.

In this form, the first work head device is concretely limited in the manufacture work machine configured to perform the assembling work. In this form, the so-called carry head such as the component holding head explained above may function as the first work bead device. It may be considered that the component holding head corresponds to the main head device configured to perform the main work described above.

(35) The manufacture work machine according to the form (34), wherein the second work head device is configured to perform one of (A) a work to be performed prior to a work of mounting the second component onto the first component, as the work necessary for mounting the second component onto the first component; and (B) a work to be performed on an article in which the second component has been mounted onto the first component.

In this form, the second work head device is concretely limited in the manufacture work machine configured to perform the assembling work. In this form, the applying head, the image taking head, etc., explained above may function as the work head device configured to perform the work to be performed prior to the work of mounting the second component onto the first component, and the image taking head, etc., may function as the work head device configured to perform the work to be performed on the article in which the second component has been mounted onto the first component. Here, each of the applying head, the image taking head, etc., may be referred to as the so-called process head and may be considered in this form as the auxiliary head device configured to perform the above-indicated auxiliary work.

(36) The manufacture work machine according to any one of the forms (31)-(35), wherein at least one of the plurality of work head devices is configured to be exchangeable with another work head device.

(37) The manufacture work machine according to the form (36), further comprising said another work head device which is exchangeable with the at least one of the plurality of work head devices.

The above two forms largely contribute to enhancement of versatility of the manufacture work machine.

<Head Moving Device>

There will be hereinafter explained some forms relating to a device for moving the work head device.

(41) The manufacture work machine according to any one of the forms (21)-(36), wherein the plurality of work-element performing apparatuses include a head moving device configured to perform movement of the work head device as one of the plurality of work elements.

The "movement of the work head device" as the function of the "head moving device" means not only movement in a narrow sense, but also "rotating motion", "pivoting motion", "vibrating motion", "swinging motion", or the like. An arrangement, a mechanism, etc., of the movement are not particularly limited, and it is possible to employ, as the head moving device, a device with various arrangements, mechanisms, etc. For instance, as explained below, there may be employed a moving device configured to move the work head device along one locus, a moving device in which at least two linear-type moving devices are combined, a moving device such as a multiarticular-arm robot, etc.

In the manufacture work machine including the plurality of work head devices, the plurality of work head devices may be configured to be moved by one head moving device. On the contrary, the plurality of work head devices may be configured to be moved by a plurality of head moving devices. More specifically, each of the plurality of work head devices may be configured to be independently moved by a corresponding one of the plurality of head moving devices. To put it the other way round, one head moving device may move a single work head device or may move the plurality of work head devices. The arrangement in which the plurality of head moving devices are configured to move the plurality of work head devices to be independent of each other is effective in a case in which the plurality of work head devices work in a cooperative manner.

(42) The manufacture work machine according to the form (41), wherein the head moving device includes a head holding portion for holding the work head device and is configured to move the work head device by moving the head holding portion.

(43) The manufacture work machine according to the form (42), wherein the work head device is configured to be attachable to and detachable from the head holding portion.

In the above two forms, further structural limitations are added to the head moving device.

<Planar-Type Moving Device>

There will be hereinafter explained some forms in which the head moving device includes a planar-type moving device.

(51) The manufacture work machine according to any one of the forms (41)-(43), wherein the head moving device includes a planar-type moving device configured to move the work head device along one plane.

(52) The manufacture work machine according to the form (51), wherein the planar-type moving device is configured to move the work head device along a horizontal plane as the one plane.

In the above two forms, there may be employed a device configured such that the head holding portion described above self-propels on a member that defines the one plane, other than an XY-type moving device which will be explained. In these forms, an XYZ-type moving device can be easily constituted by combining an up-down-direction moving device which will be explained. Where the manufacture work machine includes the plurality of work head devices, it is preferable that the plurality of work head device be moved together, namely, be moved as a unit, by one planar-type moving device, in terms of downsizing, simplification, etc., of the manufacture work machine.

(53) The manufacture work machine according to the form (51) or (52), wherein the planar-type moving device includes two linear-type moving devices configured to linearly move the work head device respectively in mutually intersecting two directions along the one plane.

(54) The manufacture work machine according to the form (53), wherein the two linear-type moving devices are configured to move the work head device respectively in mutually orthogonal two directions.

In the above two forms, the planar-type moving device is formed as the so-called XY-type moving device. The manufacture work machine according to each of the above two forms may be configured such that each of the above-indicated two linear-type moving devices functions as one work-element performing apparatus. In contrast, the head moving device or the planar-type moving device may function as one work-element performing apparatus, and each of the above-indicated two linear-type moving devices may function as the operating device of the one work-element performing apparatus. Where the manufacture work machine includes the plurality of work head devices, the manufacture work machine may be configured to include: one linear-type moving device configured to move the plurality of work head device together (integrally) in one of the two directions; and a plurality of linear-type moving devices configured to move the plurality of work head devices independently of each other in the other of the two directions. This arrangement is effective in an instance where the plurality of work head devices cooperate to each other to perform works on one work object.

(55) The manufacture work machine according to the form (53) or (54), wherein one of the two linear-type moving devices has a rod member disposed so as to extend in one of the mutually intersecting two directions.

(56) The manufacture work machine according to the form (55), wherein the rod member is a screw rod that constitutes a ball screw mechanism.

(57) The manufacture work machine according to the form (55) or (56), wherein the other of the two linear-type moving devices is configured to move the work head device in the other of the mutually intersecting two directions by translating the rod member of the one of the two linear-type moving devices in the other of the mutually intersecting two directions.

Each of the above three forms indicates a typical structure in the so-called XY-type moving device. While, in the second form among the above three forms, the rod member is a screw rod for a ball screw, the rod member may be a guide rod for guiding the movement of the work head device in the one of the mutually intersecting two directions, in the other forms.

(58) The manufacture work machine according to any one of the forms (55)-(57), wherein the one of the two linear-type moving devices is configured such that the rod member is insertable and retractable in one of the mutually intersecting two directions.

(59) The manufacture work machine according to the form (58),
wherein the other of the two linear-type moving devices is configured to move the work head device in the other of the mutually intersecting two directions by translating the rod member of the one of the two linear-type moving devices in the other of the mutually intersecting two directions, and
wherein the rod member is insertable and retractable in a state in which the rod member is located at a specific position after having been moved by the other of the two linear-type moving devices.

(60) The manufacture work machine according to the form (58) or (59), comprising an external panel which is provided at one of opposite two sides of the manufacture work machine that are opposed to each other in the one of the mutually intersecting two directions, the external panel being formed with an opening at a part thereof,
wherein the rod member is insertable and retractable through the opening.

(61) The manufacture work machine according to the form (60),
wherein the other of the two linear-type moving devices is configured to move the work head device in the other of the mutually intersecting two directions by translating the rod member of the one of the two linear-type moving devices in the other of the mutually intersecting two directions, and
wherein the opening is formed at a position at which the opening is opposed to one end portion of the rod member when the rod member is located at a specific position after having been moved by the other of the two linear-type moving devices.

In each of the above four forms, the rod member described above is configured to be insertable and retractable relative to the manufacture work machine in a direction of extension of the rod member. Each form is effective in an instance where a screw rod that constitutes the ball screw mechanism is replaced, for instance. In a system in which a plurality of manufacture work machines are disposed so as to be arranged, in particular, by forming a similar opening at a similar position in the external panel of each of adjacent manufacture work machines, the rod member can be easily replaced even if the plurality of manufacture work machines are disposed so as to be adjacent to each other. The rod member may be configured to be insertable and retractable on one of or both of the opposite two sides. Here, the opening is not limited to a hole, but may be a cutout formed in the external panel.

<Up-Down-Direction Moving Device, Movement of Head in Two Steps Relating to Up-Down-Direction Moving Device, and Image Taking Device Relating to Up-Down-Direction Moving Device>

There will be hereinafter explained some forms in which the head moving device includes an up-down-direction moving device.

(71) The manufacture work machine according to any one of the forms (41)-(61), wherein the head moving device includes an up-down-direction moving device configured to move the work head device in an up-down direction.

(72) The manufacture work machine according to the form (71),
wherein the head moving device includes a head holding portion for holding the work head device, and
wherein the up-down-direction moving device is configured to move the work head device in the up-down direction by moving the head holding portion.

The up-down-direction moving devices according to each of the above two forms may constitute the head moving device by itself or may constitute the head moving device together with the planar-type moving device explained above. In the latter case, the up-down-direction moving device functions as a device which bears a movement in the Z direction of the so-called XYZ-type moving device. The manufacture work machine may be configured such that the up-down-direction moving device functions as one work-element performing apparatus. Moreover, the manufacture work machine may be configured such that the head moving device functions as one work-element performing apparatus and the up-down-direction moving device functions as one operating device that constitutes the work-element performing apparatus.

Where the manufacture work machine includes the plurality of work head devices, the up-down-direction moving device may move the plurality of work head devices together or integrally or may move the plurality of work head devices independently of each other. In the former case, the up-down-direction moving device may be configured to have the head holding portion which is common to the plurality of work head devices. In the latter case, the up-down-direction moving device may be configured to have one head holding portion for each of the plurality of work head devices. The latter case may be considered as a form in which the head moving device includes a plurality of up-down-direction moving devices. In this respect, where the manufacture work machine includes the plurality of work head devices, it is not required for the up-down-direction moving device to move all of the work head devices, but there may exist a work head device/s that is/are not moved by the up-down direction moving device.

(73) The manufacture work machine according to the form (72), wherein the work head device includes: a main device functioning as a main working element in a work to be performed by the work head device; and a movement device held by the head holding portion and configured to move the main device relative to the head holding portion.

(74) The manufacture work machine according to the form (73), wherein the movement device is configured to move the main device relative to the head holding portion in the up-down direction.

According to the above two forms, the main device is moved by both of the movement device and the up-down-direction moving device, whereby the main device can be moved in a relatively complicated manner. In the latter form, in particular, the main device is configured to be moved in two steps, namely, the main device is configured to be moved as if the so-called telescopic mechanism is employed. Accordingly, the range of the movement of the main device in the up-down direction can be enlarged while reducing the dimensions of each device and the up-down-direction moving device in the up-down direction. Where the manufacture work machine is the assembling work machine, the work head device is the component holding head, and the main device is the component holding device, for instance, the mounting work of components can be easily performed even if the dimension, in the up-down direction, of the component held by the component holding head or the dimension, in the up-down direction, of the component onto which the component held by the component holding head is mounted are large.

(75) The manufacture work machine according to any one of the forms (71)-(74), comprising an image taking device, wherein the image taking device is configured to be moved by the up-down-direction moving device in the up-down direction, together with the work head device.

(76) The manufacture work machine according to the form (75), wherein the head moving device includes a head holding portion for holding the work head device, wherein the up-down-direction moving device is configured to move the work head device in the up-down direction by moving the head holding portion, and wherein the image taking device is attached to the head holding portion.

(77) The manufacture work machine according to the form (75) or (76), which is an assembling work machine configured to perform, as the manufacture work, an assembling work of assembling a plurality of components into an assembled article and which is configured to perform, as at least a part of the assembling work, a work of mounting, onto a first component as one of the plurality of components, a second component as another one of the plurality of components, wherein the image taking device is configured to take an image of at least one of the first component and an article in which the second component has been mounted onto the first component.

In the above three forms, the manufacture work machine includes the image taking device such as a camera, and the image taking device is moved by the up-down-direction moving device. In the above three forms, the image taking device may be one of the work head devices, i.e., one of the plurality of work-element performing apparatuses or may not be the work-element performing apparatus. Where the manufacture work machine is configured to have the plurality of work head devices apart from the image taking device, the image taking device may be configured to be moved in the up-down direction with at least one of the plurality of work head devices.

According to the above three forms, change of the image taking area of the image taking device, adjustment of focus, etc., can be carried out without depending on functions of the image taking device per se such as a zooming function, a focus adjusting function, etc. Accordingly, even in the manufacture work machine including the image taking device without such functions, it is possible to perform appropriate image taking in accordance with dimensions of a target object of the image taking.

Where the manufacture work machine is the assembling work machine and includes the component holding head (the carry head) and the process head such as the applying head explained above, it is rather preferable that the image taking device be moved with the component holding head in the up-down direction. Where the manufacture work machine is configured such that the image taking device recognizes position deviation of the first component and such that the second component held by the component holding head is mounted onto the first component on the basis of the result of recognition or where the manufacture work machine is configured such that the image taking device inspects the article in which the second component has been mounted onto the first component by the component holding head, the image taking device is preferably configured to be moved with the component holding head. Such configuration enables mounting accuracy and inspection accuracy to be maintained at a comparatively high level.

(78) The manufacture work machine according to any one of the forms (71)-(77), wherein the plurality of work-element performing apparatuses include a plurality of work head devices each as the work head device, and wherein the head moving device includes a plurality of up-down-direction moving devices which are respectively provided for the plurality of work head devices and each of which functions as the up-down-direction moving device, each of the plurality of up-down-direction moving devices being configured to move a corresponding one of the work head devices in the up-down direction.

In this form, the head moving device includes a plurality of up-down-direction moving devices. Explanation of this form will be dispensed with here since a similar structure has been already explained above.

<Conveyor and Component Supplier>

There will be hereinafter explained some forms relating to a conveyor and a component supplier.

(81) The manufacture work machine according to any one of the forms (1)-(78), which is an assembling work machine configured to perform, as the manufacture work, an assembling work of assembling a plurality of components into an assembled article and which is configured to perform, as at least a part of the assembling work, a work of mounting, onto a first component as one of the plurality of components, a second component as another one of the plurality of components, wherein the plurality of work-element performing apparatuses includes a conveyor configured to perform, as one of the plurality of work elements, conveyance of at least one of the first component which is one of the plurality of components; and the assembled article, and wherein the conveyor is configured to be exchangeable with another conveyor.

(82) The manufacture work machine according to the form (81), further comprising said another conveyor which is exchangeable with the conveyor.

(83) The manufacture work machine according to the form (81) or (84), wherein the conveyor and said another conveyor is mutually different in conveyance mechanism.

The above three forms relate to the conveyor. The arrangement in which "the conveyor and said another conveyor are mutually different in conveyance mechanism" described in the third form among the above three forms includes an arrangement in which loci of a target conveyance object formed when conveyed by the respective conveyors are mutually different, for instance. For instance, there may be included an arrangement in which one conveyor is configured to convey the target conveyance object such that the target conveyance object moves on one plane, such as the so-called belt conveyor system, while another conveyor is configured to convey the target conveyance object while lifting up the object, such as the so-called lift and carry system. The above three forms contribute to enhancement of versatility of the manufacture work machine functioning as the assembling work machine.

(86) The manufacture work machine according to any one of the forms (1)-(83), which is an assembling work machine configured to perform, as the manufacture work, an assembling work of assembling a plurality of components into an assembled article and which is configured to perform, as at least a part of the assembling work, a work of mounting, onto a first component as one of the plurality of components, a second component as another one of the plurality of components, wherein the plurality of work-element performing apparatuses include a component supplier configured to perform, as one of the plurality of work elements, supplying of the second component, and wherein the component supplier is configured to be exchangeable with another component supplier.

(87) The manufacture work machine according to the form (86), further comprising said another component supplier which is exchangeable with the component supplier.

The above two forms relate to the component supplier and contribute to enhancement of versatility of the manufacture work machine functioning as the assembling work machine. Various types of devices are employable as the component supplier, such as a tray-type component supplier configured to supply a plurality of components in a state in which the components are disposed on a tray or a feeder-type component supplier configured to supply a plurality of components by sequentially feeding a tape on which the components are held or configured to supply the components which are randomly accommodated by sequentially feeding the components while permitting the components to be placed in proper orientation.

<Manufacture Work System>

The following forms relate to a manufacture work system in which the manufacture work machines are arranged.

(91) A manufacture work system comprising a plurality of manufacture work machines each as the manufacture work machine according to any one of the forms (1)-(87), wherein the plurality of manufacture work machines are arranged such that the manufacture works by the respective manufacture work machines are sequentially performed.

According to this form, even where a manufacture work includes a plurality of steps, the system can accomplish the manufacture work by permitting one manufacture work machine to bear one step. For downsizing the system, the plurality of manufacture work machines are preferably disposed so as to be adjacent to each other. For smooth conveyance of the work object from the manufacture work machine that performs an earlier step and smooth conveyance of the work object into the manufacture work machine that performs a later step, the conveyors of the respective manufacture work machines are preferably controlled in a cooperative manner. Moreover, where the work-element performing apparatuses are used commonly in the plurality of manufacture work machines by making the bases of the respective manufacture work machines identical to each other or by unifying specifications of the bases of the respective manufacture work machines, it is possible to enhance versatility of the system per se.

BRIEF DESCRIPTION OF DRAWINGS

FIG. 13 is a table showing data format of motion commands.

DESCRIPTION OF EMBODIMENTS

There will be hereinafter explained in detail typical embodiments of the claimable invention as embodiments with reference to drawings. It is to be understood that the claimable invention may be embodied with various changes and modifications based on the knowledge of those skilled in the art, in addition to the following embodiments and various forms described in the FORMS OF INVENTION. It is further to be understood that modified embodiments can be arranged utilizing the technical matters described in the FORMS OF INVENTION.

Embodiments

<Structure of Manufacture Work Machine>

Figure 1:
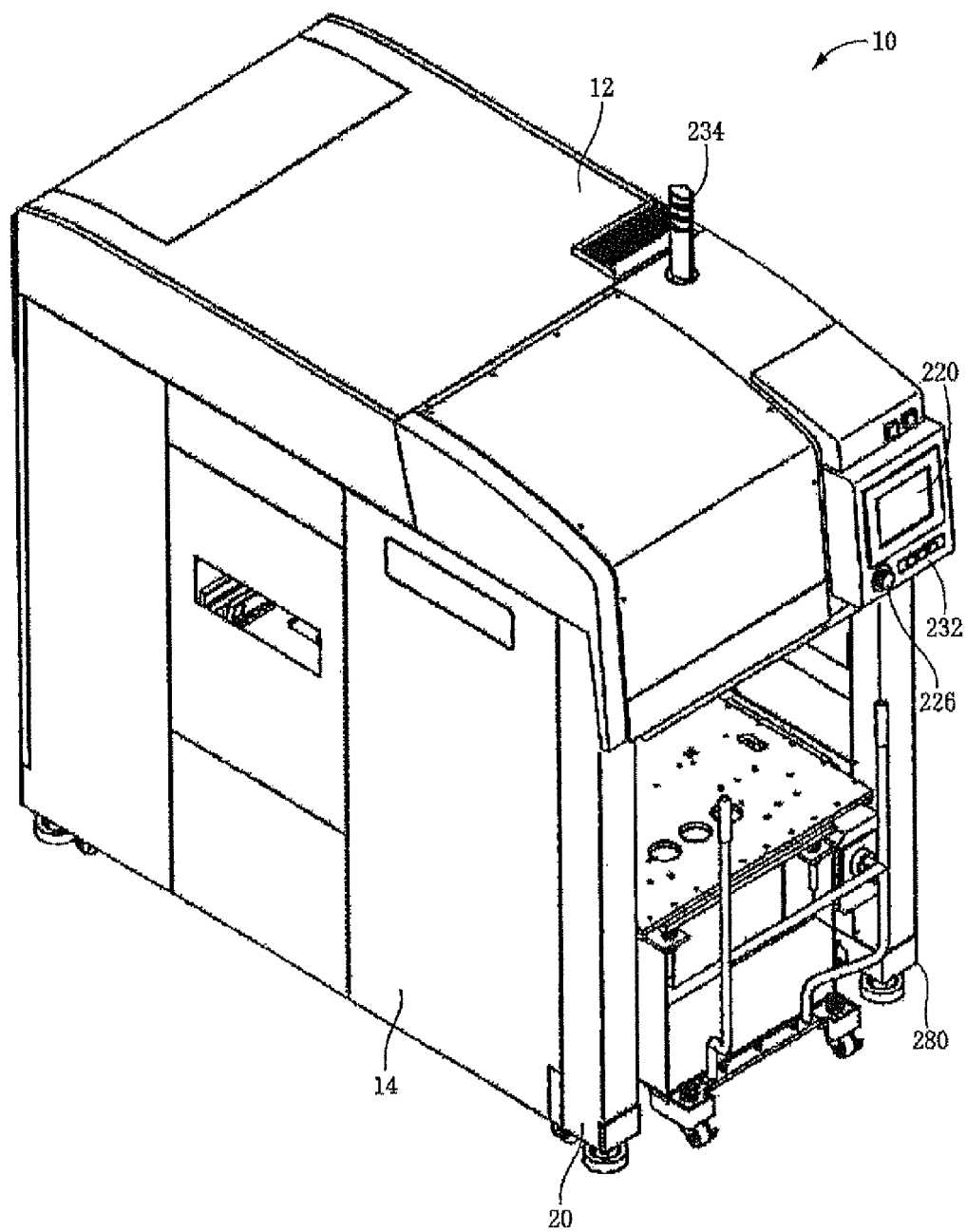
FIG. 1 is an external view showing a manufacture work machine according to one embodiment of the claimable invention.
Figure 2:
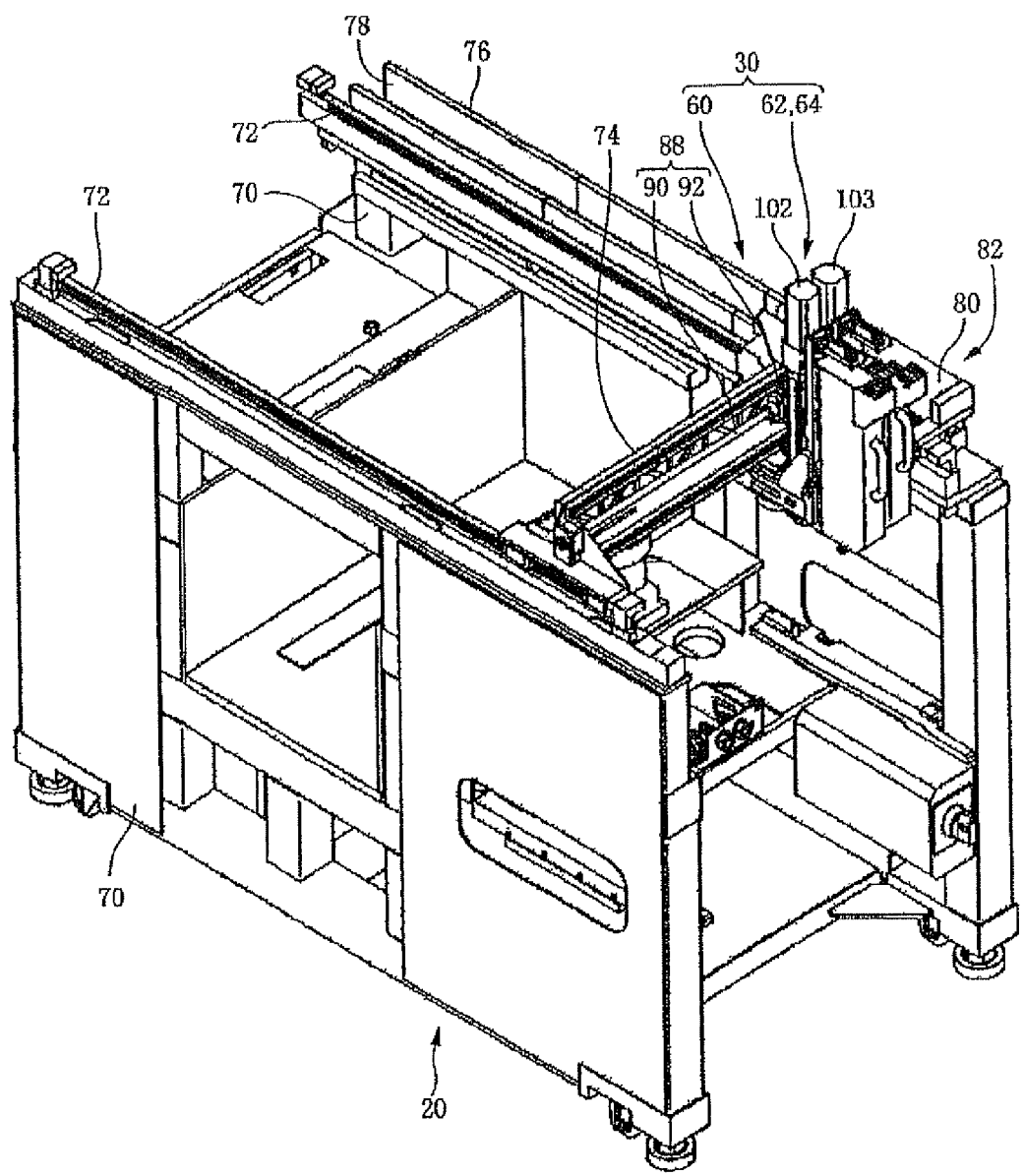
FIG. 2 is a perspective view showing the manufacture work machine of FIG. 1 in a state in which some work-element performing apparatuses thereof and a cover are detached.
Figure 3:
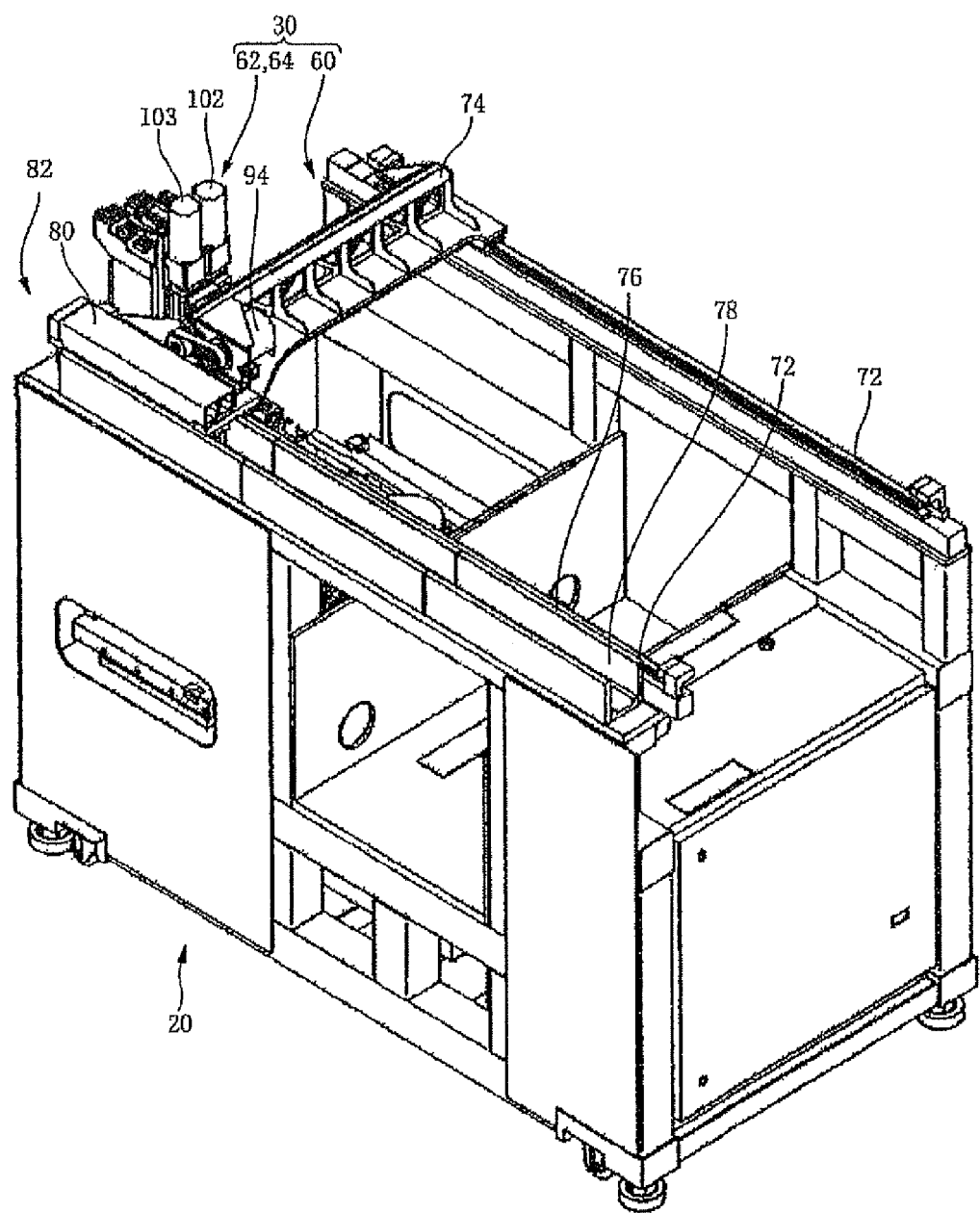
FIG. 3 is a perspective view showing the manufacture work machine as viewed from one side thereof opposite to FIG. 2.

FIGS. 1 and 3 show a manufacture work machine 10 according to one embodiment. FIG. 1 is an external view of the manufacture work machine 10. FIG. 2 is a perspective view of the manufacture work machine 10 in a state in which an upper cover 12 as an external panel, a side cover 14, etc., are removed. FIG. 3 is a perspective view of the manufacture work machine 10 as viewed from one side thereof opposite to FIG. 2. The manufacture work machine 10 is an assembling work machine configured to perform an assembling work as a manufacture work. More specifically, the manufacture work machine 10 is a work machine configured to perform a work of mounting a piece-like or block-like mount component as a second component onto a plate-like base member as a first component. The manufacture work machine 10 includes a plurality of work-element performing apparatuses each configured to perform a corresponding one of a plurality of work elements that constitute the assembling work. The plurality of work-element performing apparatuses are disposed on a frame 20 shown in FIGS. 2 and 3, as a base of the manufacture work machine 10.

Figure 4:
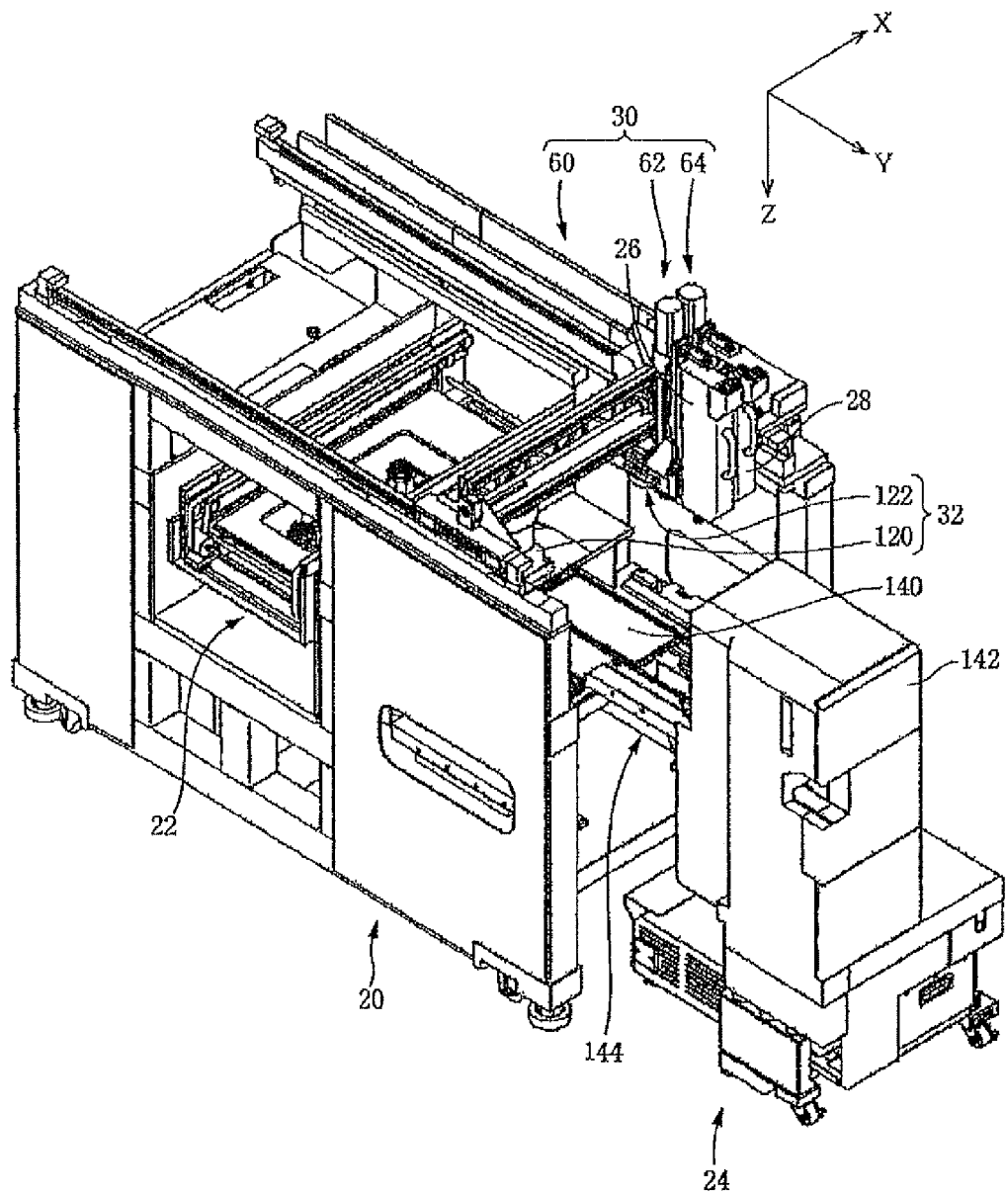
FIG. 4 is a perspective view showing the manufacture work machine of FIG. 1 in a state in which the work-element performing apparatuses thereof and the cover are attached.
Figure 5:
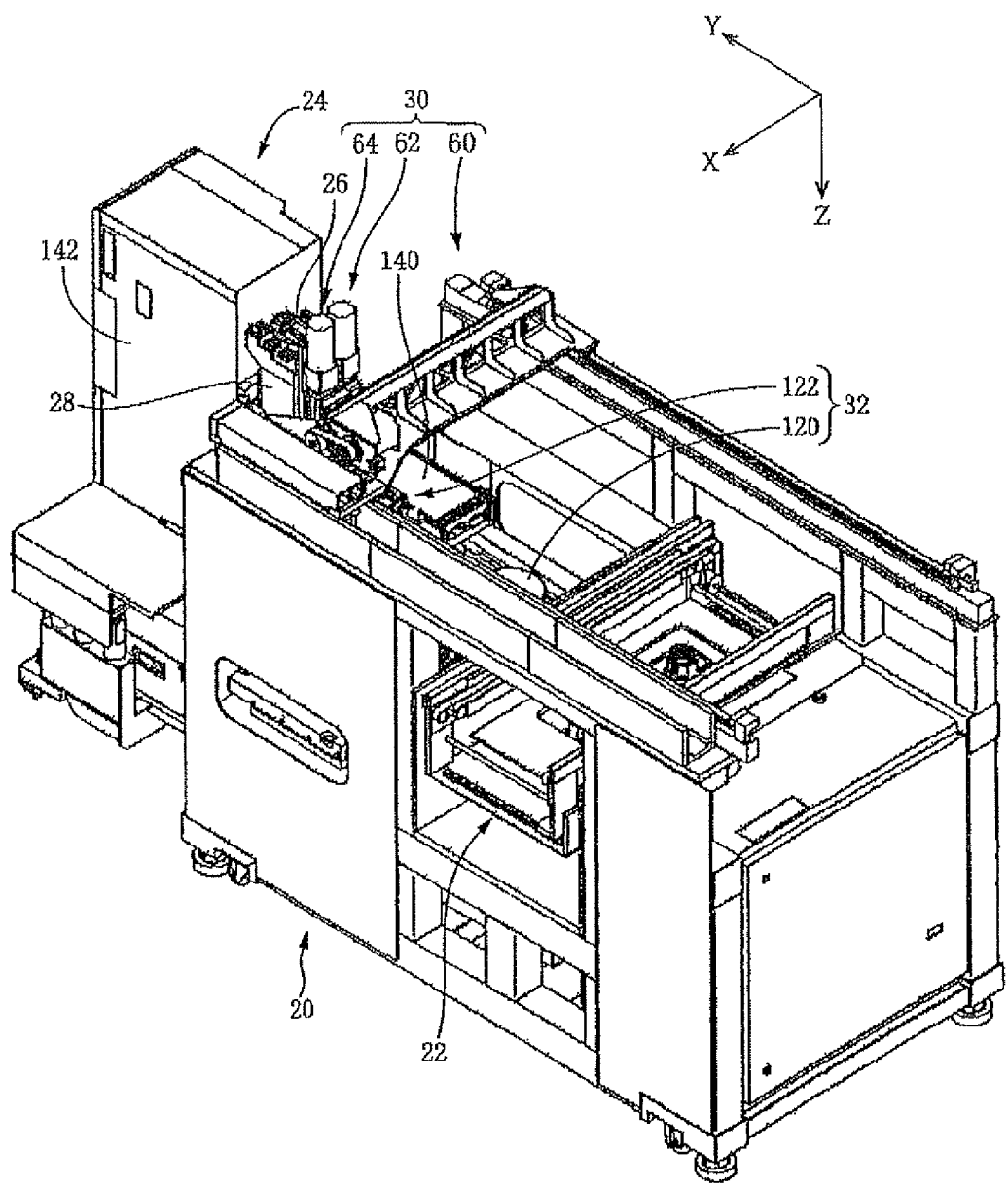
FIG. 5 is a perspective view showing the manufacture work machine as viewed from one side thereof opposite to FIG. 4.

FIGS. 4 and 5 show the manufacture work machine 10 in a state in which all of the plurality of work-element performing apparatuses are disposed in the manufacture work machine 10 of FIGS. 2 and 3. As shown in FIGS. 4 and 5, the plurality of work-element performing apparatuses include: a conveyor 22 configured to convey the base member; a component supplier 24 configured to supply mount components; a first work head device 26 as a main head device configured to perform a main work in a work of mounting the mount components onto the base member; and a second work head device 28 as an auxiliary head device configured to perform an auxiliary work for the main work. In addition, the plurality of work-element performing apparatuses include a head moving device 30 configured to move the two work head devices 26, 28 and an image taking device 32 configured to take images of the base member and the mount components. In the following explanation, a direction in which the base member is conveyed by the conveyor 22 is referred to as a left-right direction (X direction), a direction perpendicular to the left-right direction on a horizontal plane is referred to as a front-rear direction (Y direction), and a direction perpendicular to the left-right direction and the front-rear direction is referred to as an up-down direction (Z direction).

Figure 6:
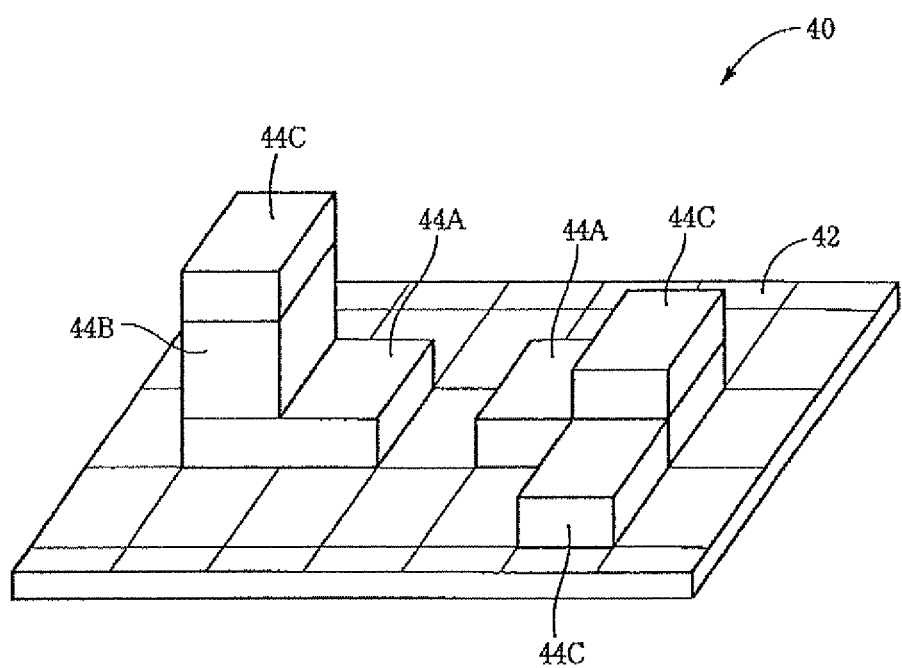
FIG. 6 is a view showing an assembled article assembled by the manufacture work machine of FIG. 4.

Referring to FIG. 6, there will be briefly explained an assembled article which is assembled by the manufacture work machine 10. The assembled article 40 is composed of a plate-like base member 42 and a plurality of block-like mount components 44 (hereinafter each referred to as the "block" where appropriate). To be more specific, two blocks 44A each having a rectangular shape in upper plan view are mounted onto the base member 42. On one of the two blocks 44A, there are stacked two square blocks 44B, 44C having mutually different height dimensions. A block 44C is stacked on the other of the two blocks 44A, and a block 44C is disposed alongside the other block 44A.

Figure 7:
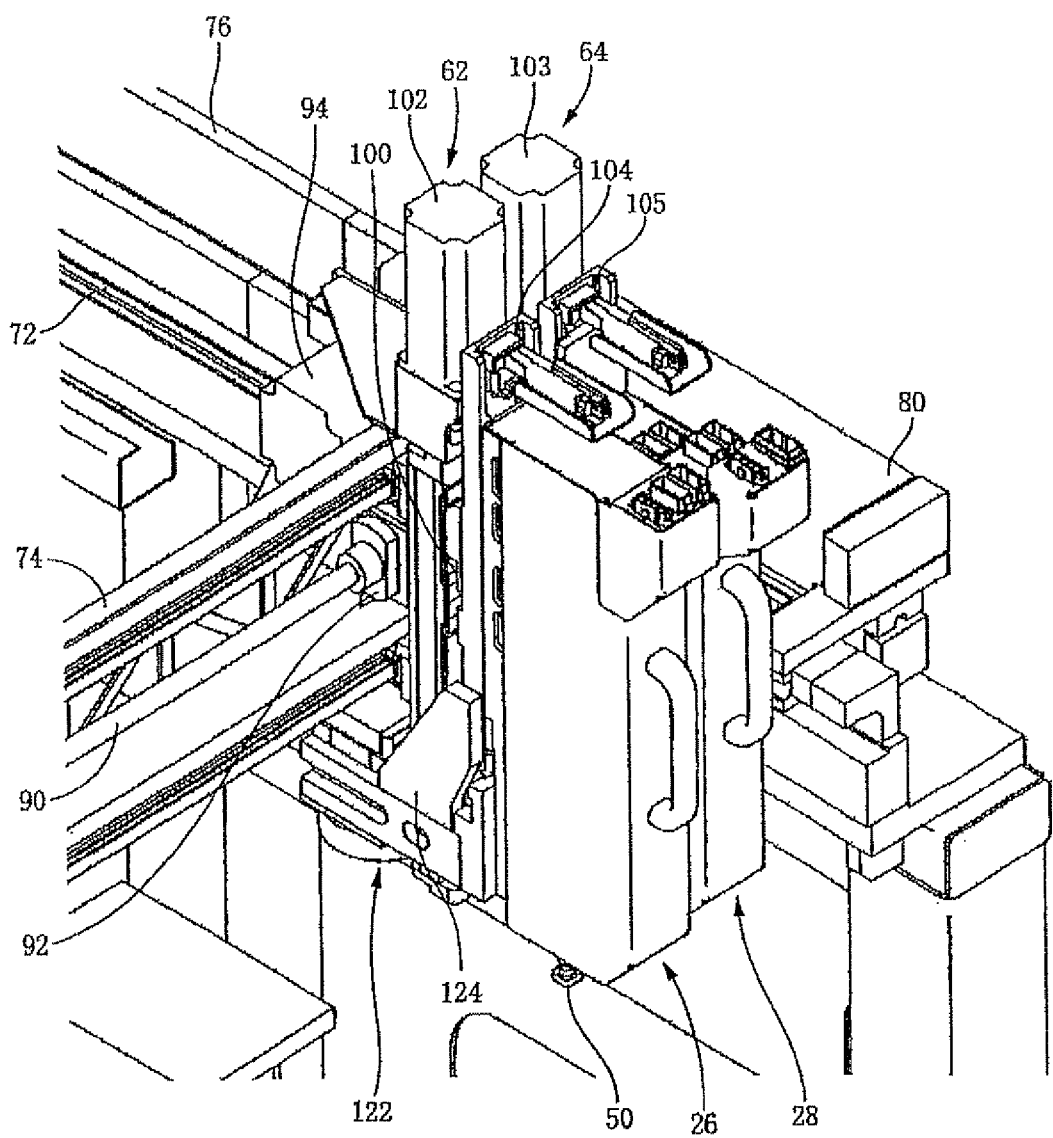
FIG. 7 is an enlarged view of a work head device shown in FIG. 4.

The first work head device 26 is a component holding head 26 (also referred to as a carry head) configured to hold the block 44 supplied from the component supplier 24 so as to convey the block 44. As shown in FIG. 7, the component holding head 26 has, at a lower end thereof, a component suction nozzle 50 and is capable of suction-hold and separate the block 44. More specifically, the component suction nozzle 50 communicates with a negative-pressure air passage and a positive-pressure air passage via a positive/negative pressure supplier 52 (FIG. 12) and is configured to suction-hold the component by a negative pressure and to separate the suction-held component by a slight positive pressure supplied thereto. That is, the component holding head 26 as the carry head functions as a work-element performing apparatus configured to perform holding and separation of the component, as one of the plurality of work elements.

Figure 8:
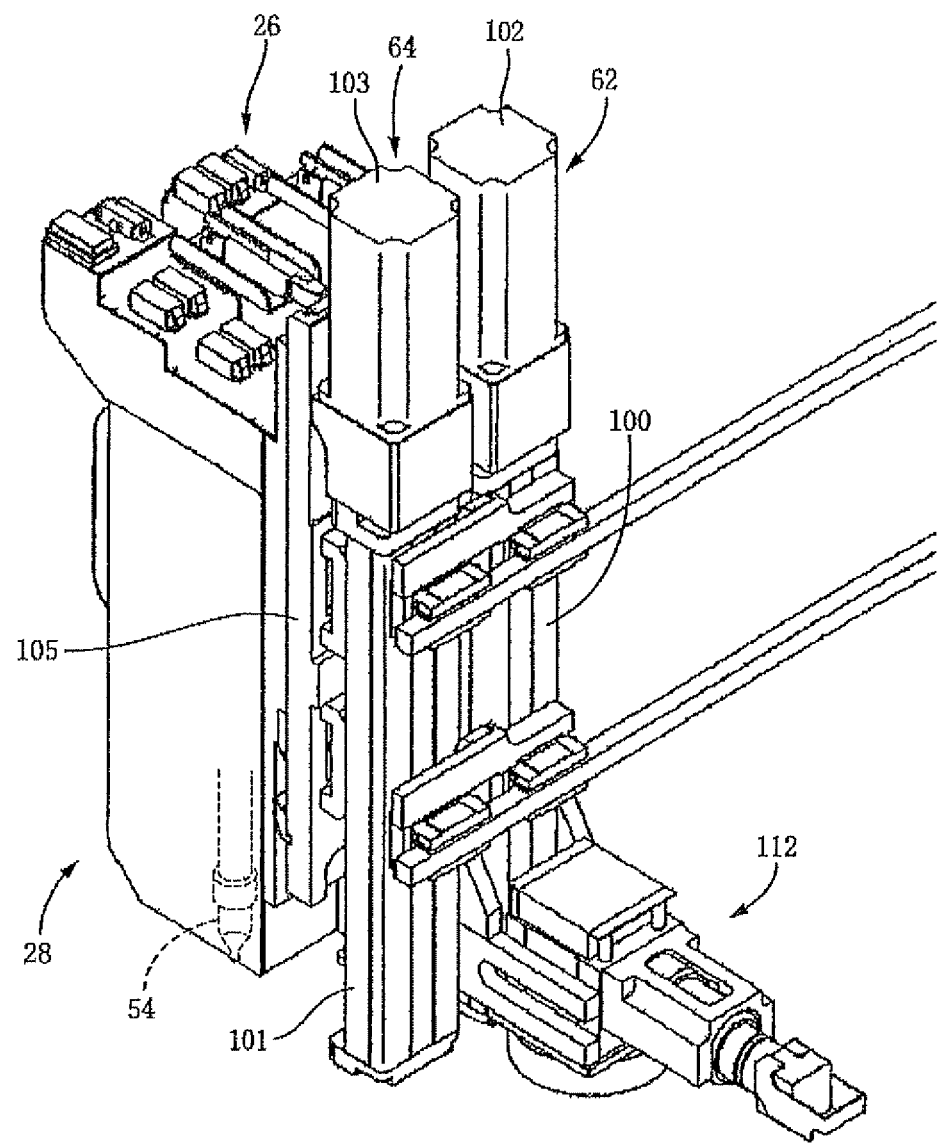
FIG. 8 is a perspective view showing the work head device as viewed from one side thereof opposite to FIG. 7.

On the other hand, the second work head device 28 is a process head configured to perform an auxiliary work element necessary for mounting, onto the base member 42, the block 44 conveyed by the component holding head 26. More specifically, as shown in FIG. 8, the second work head device 28 as the process head is a dispenser head 28 having, at its lower end, a dispenser nozzle 54 and an ejection device 58 (FIG. 12) for ejecting an arbitrary amount of an adhesive from the dispenser nozzle 54. That is, the dispenser head 28 functions as a work-element performing apparatus configured to perform, as one of the plurality of work elements, application of the adhesive as a work performed prior to the work of mounting the blocks 44 onto the base member 42 or the work of mounting another block 44 onto the already mounted blocks 44.

As mentioned above, the two work head devices 26, 28 are moved by the head moving device 30. As shown in FIGS. 2-5, the head moving device 30 is an XYZ-robot-type moving device and is disposed at an upper end of the frame 20. More specifically, the head moving device 30 includes: a planar-type moving device 60 configured to move the two work head devices 26, 28 together along the horizontal plane; and two up-down-direction moving devices (Z-direction moving devices) 62, 64 each configured to independently move a corresponding one of the two work head devices 26, 28 in the up-down direction. As will be later explained in detail, the planar-type moving device 60 is constituted by two linear-type moving devices, namely, an X-direction moving device 66 configured to linearly move the two work head devices 26, 28 in the left-right direction (the X direction) and a Y-direction moving device 68 configured to linearly move the two work head devices 26, 28 in the front-rear direction (the Y direction). The planar-type moving device 60 is for moving the two work head devices 26, 28 to respective arbitrary positions on the horizontal plane. As will be later explained in detail, the up-down-direction moving devices 62, 64 are configured to be moved by the planar-type moving device 60 on the horizontal plane, together with the work head devices 26, 28 and is configured to lower the work head devices 26, 28 and to elevate the work head devices 26, 28 from the lowered positions, at the respective arbitrary positions on the horizontal plane. There will be explained in detail a structure of the head moving device 30.

The frame 20 has, at opposite ends thereof in the left-right direction, a pair of wall portions 70 (functioning also as an external panel) which extend in the front-rear direction. Rails 72 are disposed on upper ends of the respective wall portions 70. A beam 74 is bridged over the rails 72 so as to extend therebetween, and the beam 74 is movable in the front-rear direction along the pair of rails 72. On one of the rails 72, a guide rail 76 having a U-letter like cross sectional shape is provided so as to extend in parallel with the one rail 72 and so as to be upwardly open. A magnet 78 as a stator is fixed to an inside of the guide rail 76. At one of opposite ends of the beam 74 at which the guide rail 76 is disposed, an electromagnetic coil 80 as a movable element is fixed so as to be accommodated in the guide rail 76. That is, a linear motor 82 is constituted by the guide rail 76, the magnet 78, and the electromagnetic coil 80, and the beam 74 is configured to be translated by the linear motor 82 in the front-rear direction.

The beam 74 is provided with a ball screw mechanism 88. To be more specific, a screw rod 90 formed with a screw groove is rotatably held by the beam 74 so as to extend in the left-right direction, and a nut 92 holding bearing balls is held nonrotatably relative to the beam 74 while being in engagement with the screw groove of the screw rod 90. The screw rod 90 is configured to be rotated by an electromagnetic motor 94 fixed to the beam 74. In other words, the screw rod 90 is rotated by the electromagnetic motor 94, whereby the nut 92 is moved in the left-right direction.

The two up-down-direction moving devices 62, 64 are fixed to the nut 92 so as to be parallel to each other. The two up-down-direction moving devices 62, 64 are similar in construction. That is, each of the up-down-direction moving devices 62, 64 is constituted by: a ball screw mechanism 100, 101 including a rotatably held screw rod so as to extend in the up-down direction and a nut which is in engagement with the screw rod; an electromagnetic motor 102, 103 for rotating the screw rod; and a slider 104, 105 fixed to the nut and configured to slide in the up-down direction. The component holding head 26 is held by the slider 104 while the dispenser head 28 is held by the slider 105. In other words, the sliders 104, 105 of the respective two up-down-direction moving devices 62, 64 function as a head holding portion of the head moving device 30 for holding the work head devices 26, 28.

In view of the above structure, the planar-type moving device 60 is configured to have the X-direction moving device 66 and the Y-direction moving device 68 for linearly moving the work head devices 26, 28 in mutually intersecting two directions along the horizontal plane. The X-direction moving device 66 is configured to move the sliders 104, 105 as the head holding portion in the left-right direction by the ball screw mechanism 88 provided on the beam 74, thereby moving the work head devices 26, 28 in the left-right direction. The Y-direction moving device 68 is configured to move the beam 74 on which the screw rod 90 is provided, in the front-rear direction by the linear motor 82, thereby moving the two work head devices 26, 28 in the front-rear direction.

Figure 9:
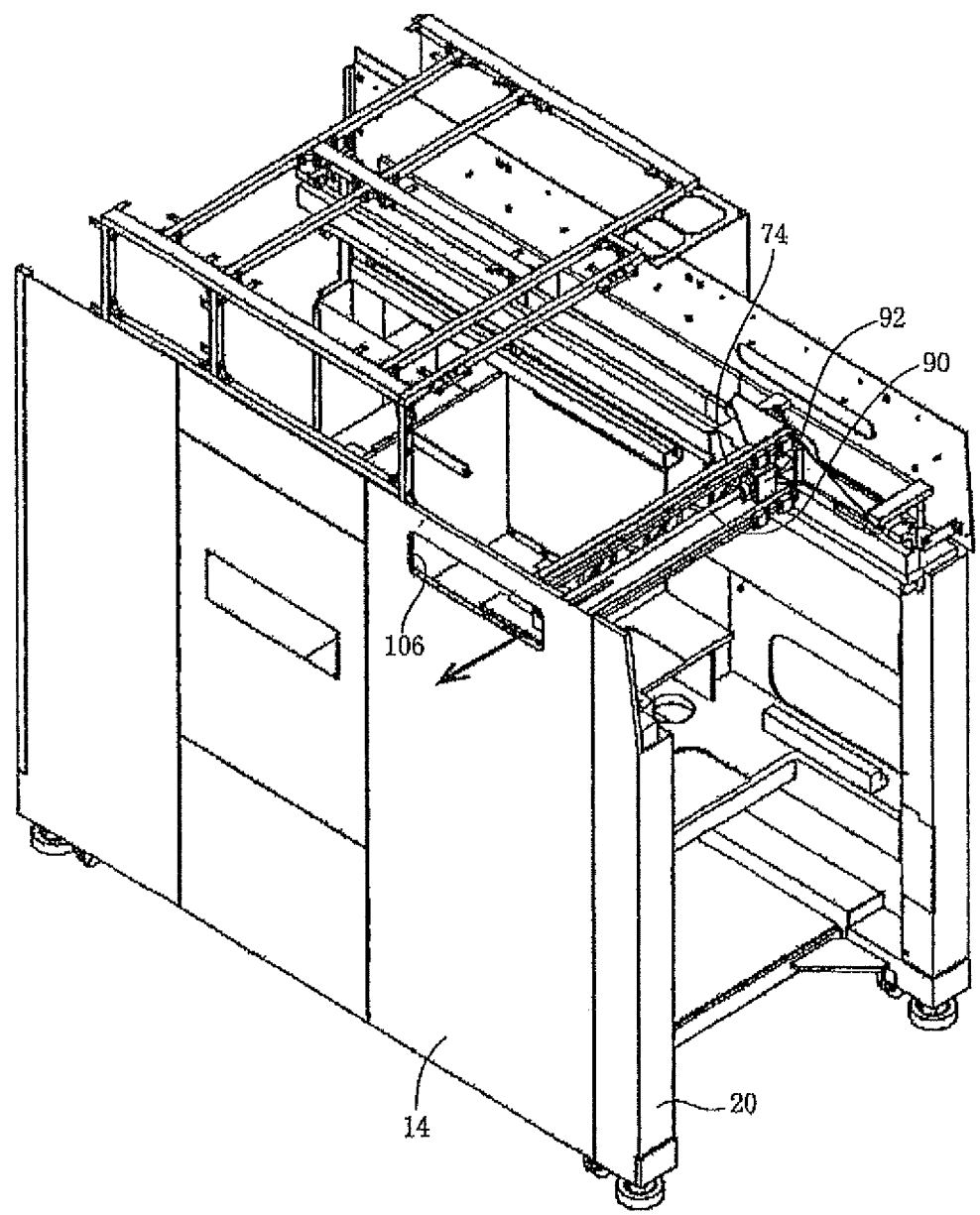
FIG. 9 is a view showing a manner of inserting and retracting a rod member of a head moving device shown in FIG. 9.

As shown in FIG. 9, the side cover 14 of the manufacture work machine 10 is formed with an opening 106. The opening 106 is formed at a position at which the opening 106 is opposed to one end of the screw rod 90 as a rod member which is provided on the beam 74, in a state (at the position shown in FIG. 9) in which the beam 74 is located at the most frontward position by the planar-type moving device 60. That is, where it is needed to replace the screw rod 90 due to some failure or the like, the screw rod 90 can be retracted or inserted in an axis direction thereof through the opening 106.

Figure 10B:
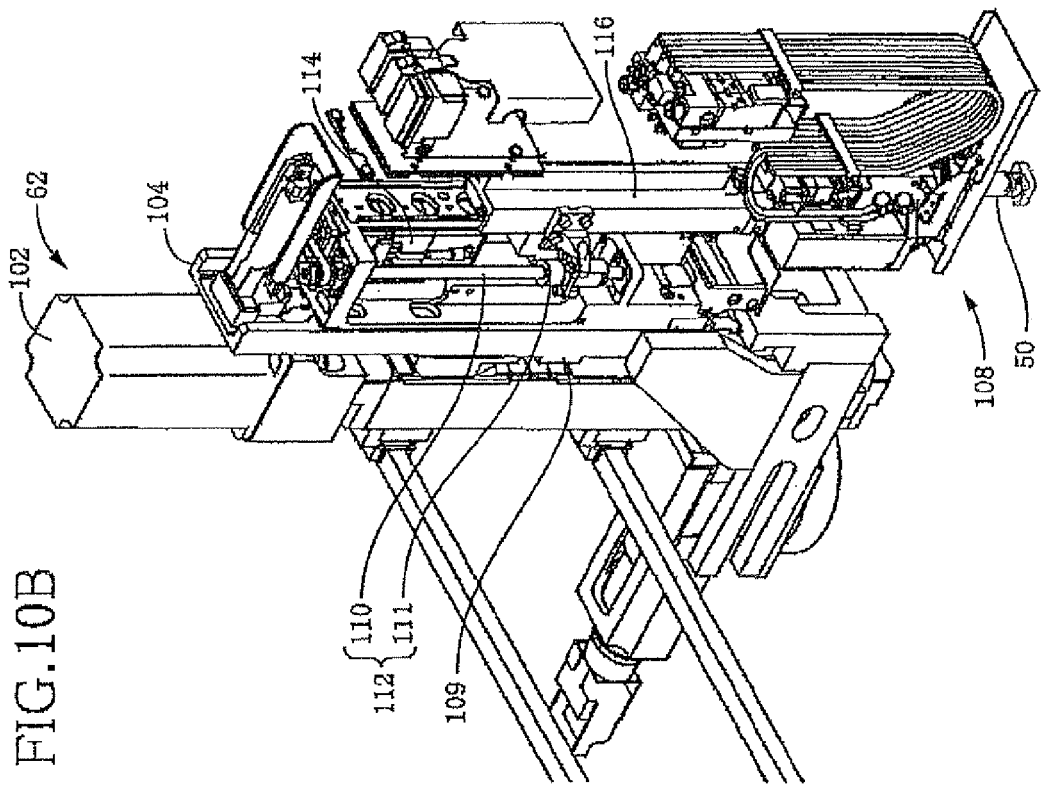
FIG. 10 is a perspective view showing the work head device shown in FIG. 7 whose cover is not illustrated.
Figure 10A:
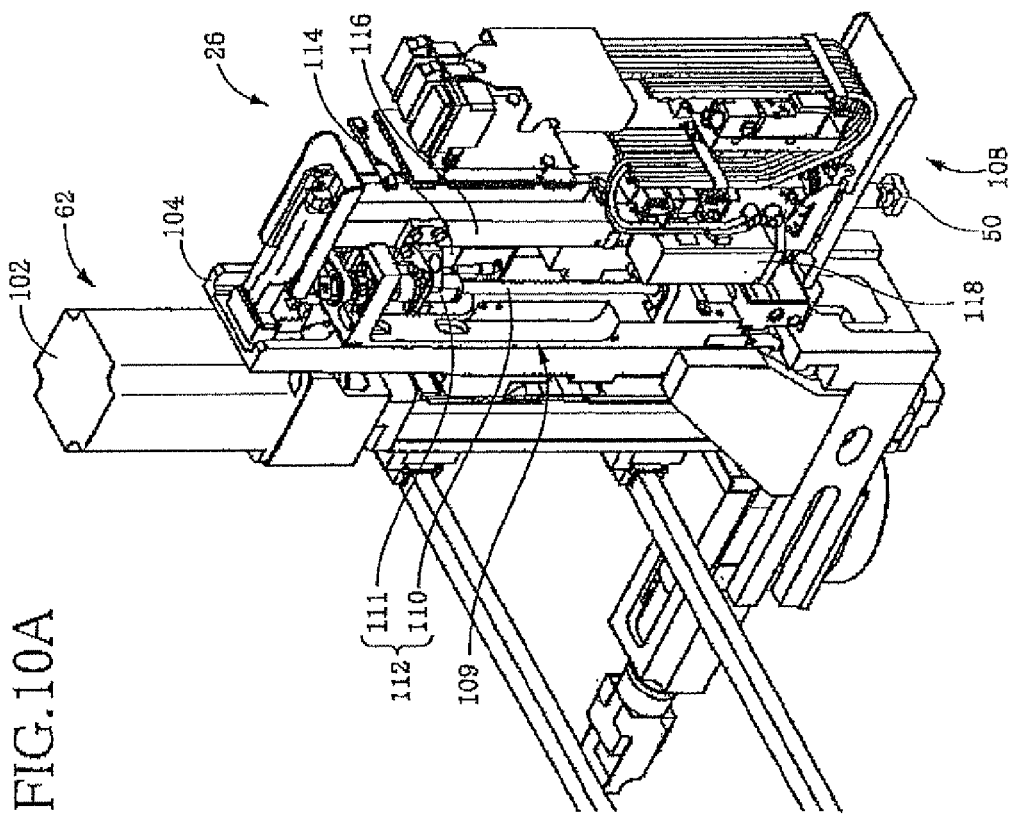

FIG. 10 shows the component holding head 26 in which its cover is not illustrated. The component holding head 26 includes: a component holder 108 as a main device constituted by the component suction nozzle 50 as a main working element in a work to be performed by the component holding head 26; and a holder moving device 109 as a movement device held by the slider 104 and configured to move the component holder 108. More specifically, the holder moving device 109 includes: a ball screw mechanism 112 constituted by a screw rod 110 disposed so as to extend in the up-down direction and a nut 111 screwed with the screw rod 110; an electromagnetic motor 114 for rotating the screw rod 110; and a main-device holder 116 fixed to the nut 111 for holding the component holder 108. That is, as shown in FIG. 10(b), the holder moving device 109 is capable of moving the component holder 108 in the up-down direction relative to the slider 104 to which the holder moving device 109 is attached. Accordingly, by combining the holder moving device 109 with the above-explained up-down-direction moving device 62 of the head moving device 30, it is possible to move the component holder 108 in two steps in the up-down direction. The thus configured component holding head 26 enables the movement range of the component holder 108 in the up-down direction to be enlarged while reducing the dimensions, in the up-down direction, of each device and the up-down-direction moving device 62. In other words, even where the dimension of the mount component in the up-down direction is large or the dimension of the assembled article in the up-down direction is large, it is possible to easily perform the work for mounting.

The component holder 108 includes a nozzle rotating device 119 which has an electromagnetic motor 118 for rotating the component suction nozzle 50. That is, the component holding head 26 can adjust orientation deviation of the component held by itself, more specifically, deviation of the component in the rotational direction about the axis that extends in the up-down direction.

The image taking device 32 includes: a base camera 120 (FIGS. 2-5) for taking an image of the block 44 held by the component holding head 26; and a head camera 122 (FIGS. 2-5, 7, and 8) for taking an image of the base member 42 on the conveyor 22. The base camera 120 is provided on the frame 20 between the conveyor 22 and the component supplier 24 and is capable of performing image taking upwardly thereof. As will be explained later in detail, the component holding head 26 that holds the mount component 44 is moved above the base camera 120 so as to take an image of the mount component 44. On the basis of data of the taken image, the position deviation and the orientation deviation (deviation in the rotational direction about the axis) of the component 44 with respect to the component holding head 26 axe recognized. On the other hand, the head camera 122 is held by the slider 104 by which the component holding head 26 is held. More specifically, at a lower end portion of the slider 104 corresponding to the component holding head 26, a backwardly protruding bracket 124 is provided. The head camera 122 is attached to the bracket 124 so as to extend out backward, such that the head camera 122 is capable of performing image taking downwardly thereof. As will be later explained in detail, the head camera 122 is capable of taking images of the base member 42 on the conveyor 22 and the mount components 44 on the component supplier 24. On the basis of data of the taken images, the position deviation and the orientation deviation of the base member 42, the position of the component 44 before it is held, etc., are recognized. Further, the head camera 122 is configured to be moved with the component holding head 26 in the up-down direction by the up-down-direction moving device 62. That is, a distance between the image taking position of the head camera 122 and the component hold position by the component holding head 26 is made comparatively small, thereby reducing errors upon mounting and enabling mounting accuracy to be maintained at a comparatively high level. Here, each of the base camera 120 and the head camera 122 may be regarded as the image taking device, and the manufacture work machine 10 may be regarded to have two image taking devices.

Figure 11A:
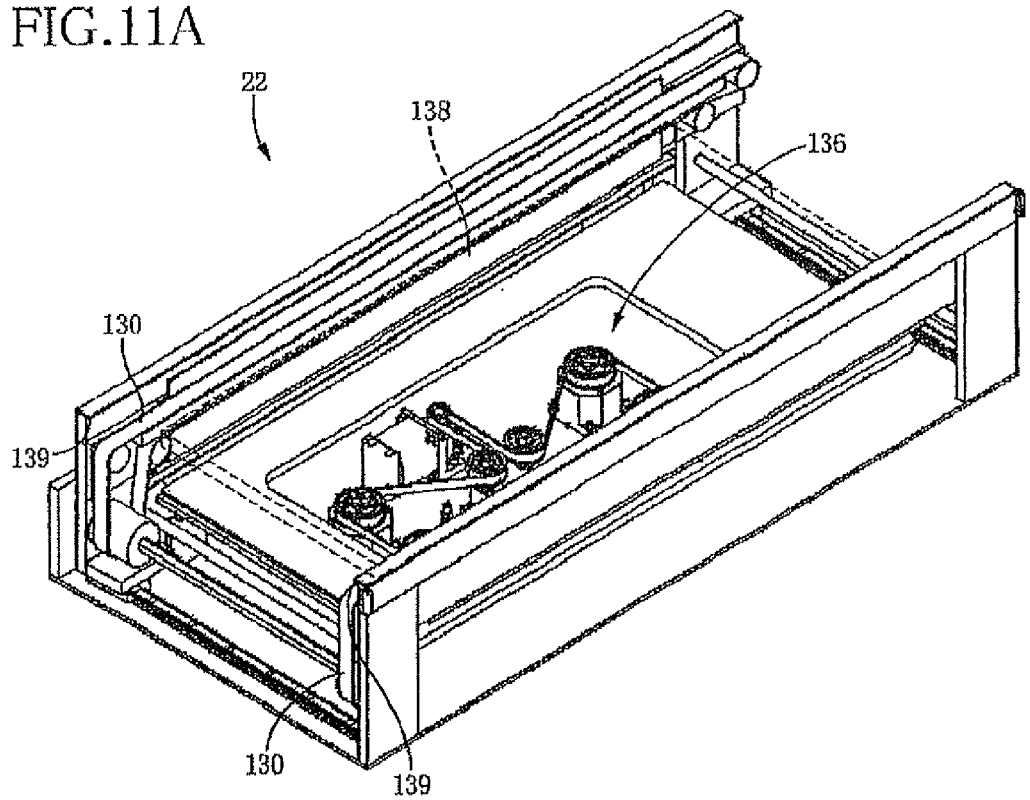
FIG. 11 is an enlarged view of a conveyor shown in FIG. 4.
Figure 11B:
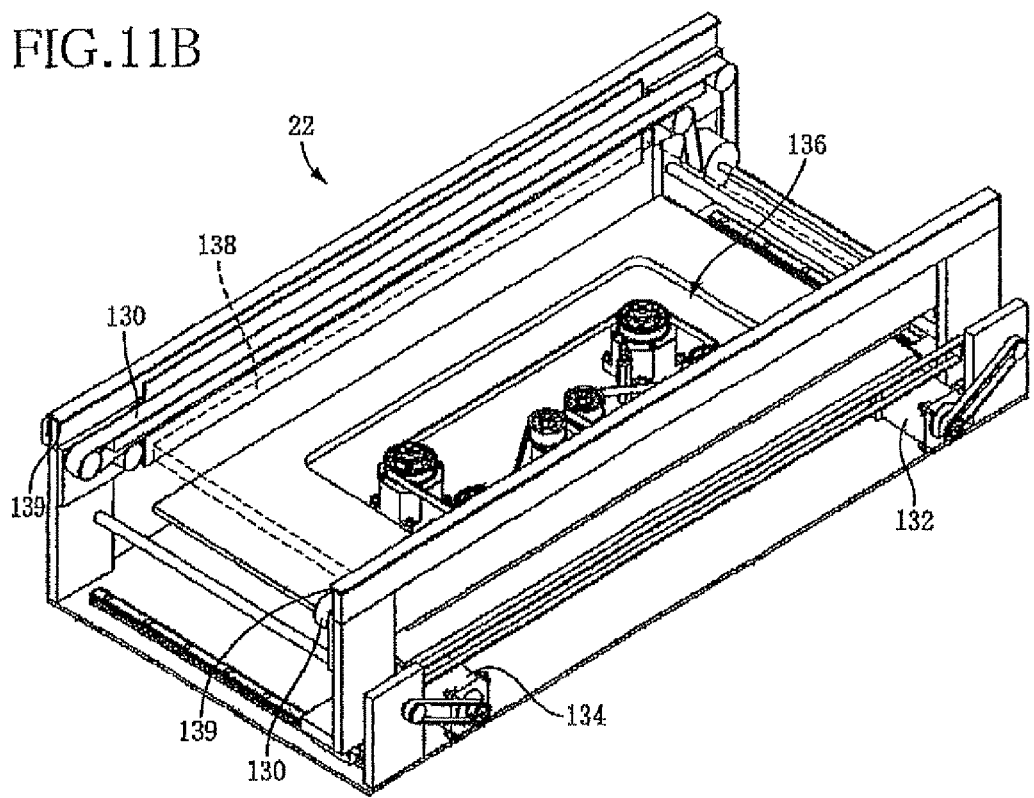

FIG. 11 is a perspective view of the conveyor 22. FIGS. 11(a) and 11(b) are perspective views of the conveyor 22 as viewed from one and the other side of the conveyor 22. The conveyor 22 has a belt rotating device 128 and is configured to rotate a pair of conveyor belts 130 by a conveyance motor 132, thereby conveying the base member 42 on the conveyor belts 130 in the left-right direction. While a detailed explanation is dispensed with, one of the conveyor belts 130 is configured to be moved in the front-rear direction by an electromagnetic motor 134 so as to deal with base members with various width dimensions. The conveyor 22 further has an elevating and lowering device 136. By elevating an elevating and lowering table 138, it is possible to sandwich the base member 42 between the elevating and lowering table 138 and flanges 139 respectively provided on upper portions of the respective conveyor belts 130, so as to fix the base member 42 therebetween. The conveyor 22 functions as a work-element performing apparatus configured to perform, as one of the plurality of work elements, conveyance of the base member 42 to a specific position, holding of the base member 42 at the specific position, and conveyance of an article in which the blocks 44 have been mounted onto the base member 42 out of the manufacture work machine 10.

The component supplier 24 is a supplier of tray unit type (tray type) and includes: an accommodating portion 142 in which are accommodated a plurality of component trays 140 on each of which the blocks 44 are placed: and a tray moving device 144 configured to move any one of the plurality of component trays 140 from the accommodating portion 142 to a position at which the component can be supplied to the component holding head 28. That is, the component supplier 24 functions as a work-element performing apparatus configured to perform supplying of the components as one of the plurality of work elements. On each of the plurality of component trays 140, the blocks 44 for completing one assembled article 40 shown in FIG. 6 are placed at respective predetermined positions of the tray 140. After one completed assembled article 40 is conveyed out and a next base member 42 is conveyed in, the component supplier 24 moves a new component tray for replacement with the empty tray.

The manufacture work machine 10 includes six work-element performing apparatuses, i.e., the conveyor 22, the component supplier 24, the component holding head 26, the dispenser head 28, the head moving device 30, and the image taking device 32. Each of the six apparatuses has an individual control device, and at least one operating device for performing a target work element corresponding thereto is controlled by the individual control device.

Figure 12:
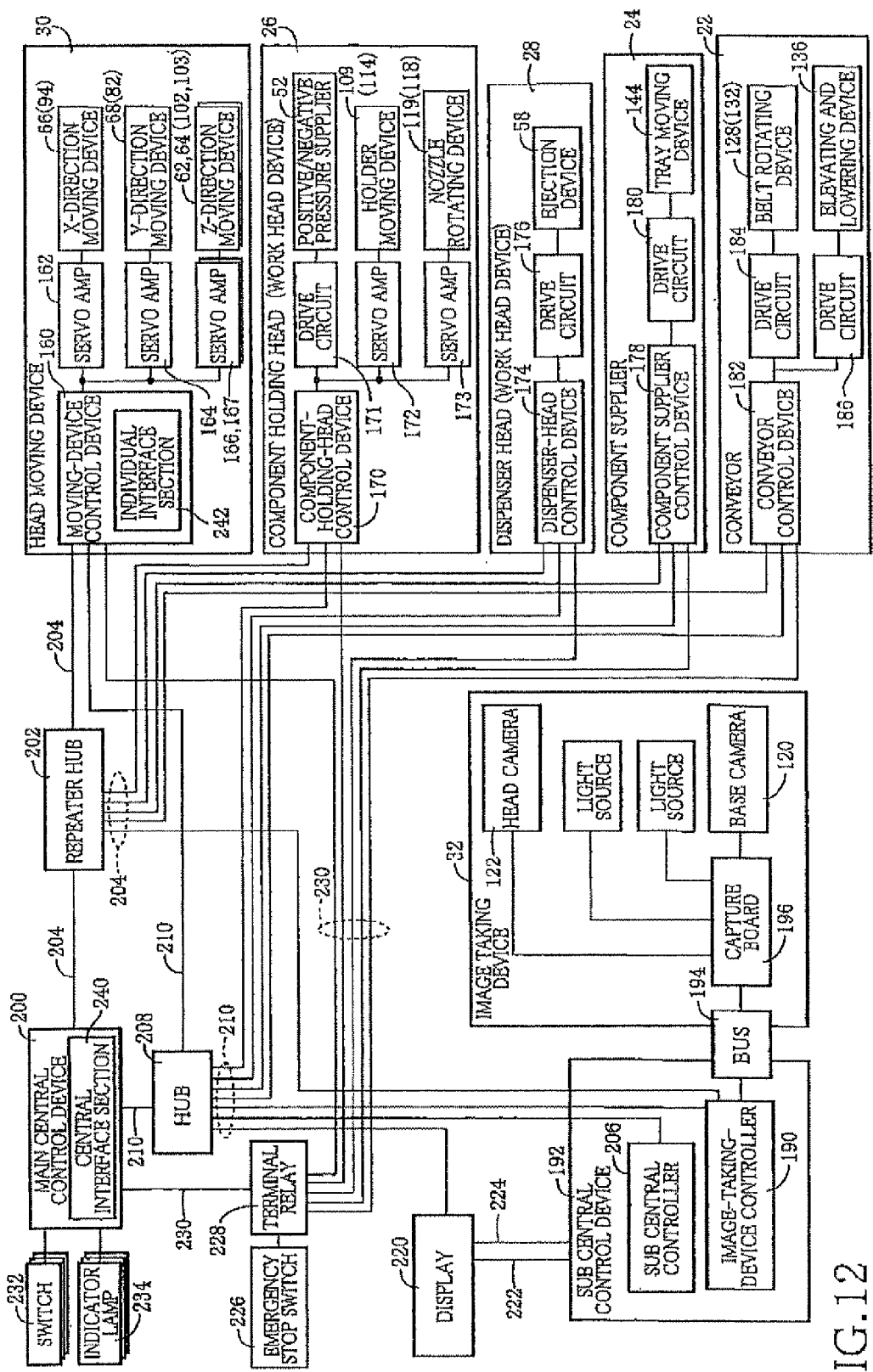
FIG. 12 is a block diagram schematically showing the manufacture work machine of FIG. 1.

More specifically, as shown in FIG. 12, the head moving device 30 includes a moving-device control device 160, as the individual control device, configured to control operations of the X-direction moving device 66, the Y-direction moving device 68, and the two Z-direction moving devices 62, 64, each as the operating device, namely, operations of the four motors 82, 94, 102, 103 of the respective four devices 66, 68, 62, 64. The head moving device 30 further includes four servo amps 162, 164, 166, 167 which respectively correspond to the four motors 82, 94, 102, 103. The moving-device control device 160 is configured to transmit a control signal to each of the servo amps 162, 164, 166, 167, thereby controlling the operations of the X-direction moving device 66, the Y-direction moving device 68, and the two Z-direction moving devices 62, 64.

The component holding head 26 includes a component-holding-head control device 170, as the individual control device, configured to control the operations of the positive/negative pressure supplier 52, the holder moving device 109, and the nozzle rotating device 119, each as the operating device, namely, the operations of the two electromagnetic motors 114, 118. The component holding head 26 includes a drive circuit 171 for the positive/negative pressure supplier 52 and two servo amps 172, 173 respectively corresponding to the two electromagnetic motor 114, 118. The component-holding-head control device 170 is configured to transmit a control signal to each of the drive circuit 171 and the servo amps 172, 173, thereby controlling the operations of the positive/negative pressure supplier 52, the holder moving device 109, and the nozzle rotating device 119. The dispenser head 28 includes a dispenser-head control device 174, as the individual control device, configured to control the operation of the ejection device 58. The dispenser head 28 further includes a drive circuit 176 for the ejection device 58. The dispenser-head control device 174 is configured to transmit a control signal to the drive circuit 176, thereby controlling the operation of the ejection device 58.

The component supplier 24 includes a supplier control device 178, as the individual control device, configured to control the operation of the tray moving device 144. The component supplier 24 further includes a drive circuit 180 of a motor as a drive source for the tray moving device 144. The supplier control device 178 is configured to transmit a control signal to the drive circuit 180, thereby controlling the operation of the tray moving device 144. The conveyor 22 includes a conveyor control device 182, as the individual control device, configured to control operations of the belt rotating device 128 and the elevating and lowering device 136. The conveyor 22 further includes a drive circuit 184 for the conveyance motor 132 of the belt rotating device 128 and a drive circuit 186 for an electromagnetic motor as a the drive source for the elevating and lowering device 136. The conveyor control device 182 is configured to transmit a control signal to each of the drive circuits 184, 186, thereby controlling the operations of the belt rotating device 128 and the elevating and lowering device 136.

The image taking device 32 includes, as the individual control device, an image-taking-device controller 190 for executing transmission of a control signal to perform image taking by the base camera 120 and the head camera 122 and for executing processing of image data obtained by the image taking. While the image-taking-device controller 190 is provided in a sub central control device 192 which will be explained, the image-taking-device controller 190 is independent in the sub central control device 192 and is connected to a capture board 196 of the image taking device 32 via a bus 194. Therefore, the image-taking-device controller 190 is not treated as a constituent element of the sub central control device 192, but is treated as a constituent element of the image taking device 32.

The manufacture work machine 10 further includes a central control device constituted by: a main central control device 200 configured to control, in a centralized manner, the above-described six work-element performing apparatuses, i.e., the conveyor 22, the component supplier 24, the component holding head 26, the dispenser head 28, the head moving device 30, and the image taking device 32, and the sub central control device 192. The main central control device 200 is mainly for transmitting a motion command to each of the individual control devices 160, 170, 174, 178, 182, 190 of the respective apparatuses 22, 24, 26, 28, 30, 32. The main central control device 200 is connected, via a repeater hub 202, to the individual control devices 160, 170, 174, 178, 182, 190 by respective serial communication cables 204 of the same kind for transmission of the motion commands. The sub central control device 192 includes a sub central controller 206. In the sub central controller 206, there is stored a source program which is a basis of the motion commands to the individual control devices, namely, source data for performing a specific manufacture work. In the stored source data, the operation of each of the six work-element performing apparatuses is encoded. The sub central controller 206 is configured to convert the source data into the motion commands in a specific programming language and to transmit the converted motion commands to the main central control device 200. The sub central controller 206 and the main central control device 200 are connected to each other by a LAN cable 210 via a hub 208, and the motion commands converted in the sub central controller 206 are transmitted to the main central control device 200 via the LAN cable 210. To the hub 208, one end of each of six LAN cables 210 which are identical to the LAN cable 210 in kind is connected, and another end of each of the six LAN cables 210 is connected to a corresponding one of the individual control devices of the respective work-element performing apparatuses. Each of the serial communication cables 204 and the LAN cables 210 is constituted by a wire portion and connector portions, each of which may be a general-purpose item or a special item developed exclusively for the present manufacture work machine 10.

As shown in FIG. 1, the manufacture work machine 10 is provided with a display 220 of a touch-panel type through which information as to the operation of the manufacture work machine 10 is inputted and outputted. The display 220 is connected to: the main central control device 200 by a LAN cable 210 which is identical to the LAN cable 210 in kind via the hub 208; and the sub central controller 206 by a serial communication cable 222 and an RGB analog cable 224. The manufacture work machine 10 further includes an emergency stop switch 226 which is connected to the main central control device 200 and the individual control devices of the respective work-element performing apparatuses by I/O cables 230 via a terminal relay 228. To the main central control device 200, there are connected: a plurality of switches 232 such as a power source switch and a startup switch of the manufacture work machine 10; and a plurality of indicator lamps 234 such as an indicator lamp indicating that the manufacture work machine 10 is in startup and an indicator lamp indicating that the manufacture work machine 10 is in an operable state.

<Operation of Manufacture Work Machine>

In the present manufacture work machine 10, the above-described six work-element performing apparatuses perform respective operations according to the source data stored in the sub central controller 206, whereby a mounting work of mounting the components 44 onto the base member 42 is performed. More specifically, the source data relating to the assembling work is initially converted in the sub central controller 206 into a plurality of motion commands shown in FIG. 13. The plurality of motion commands are transmitted from the sub central controller 206 to the main central control device 200 via the LAN cable 210 and are sequentially transmitted by the main central control device 200 to the individual control devices of the respective six work-element performing apparatuses via the respective serial communication cables 204. The motion commands transmitted from the main central control device 200 are transmitted to the individual control devices of all of the work-element performing apparatuses without particularly specifying destination device. However, each motion command designates the work-element performing apparatus to be operated by the motion command. Therefore, the individual control device of the work-element performing apparatus to be operated receives the motion command, and the work-element performing apparatus in question operates in accordance with the motion command. That is, the main central control device 200 includes a central interface section 240 (FIG. 12) for transmitting, according to one protocol, the motion command to each the plurality of work-element performing apparatuses, and the individual control device of each of the plurality of work-element performing apparatuses includes an individual interface section 242 for receiving, according to the one protocol, the motion command transmitted from the main central control device 200. While the individual interface section 242 is indicated only in the moving-device control device 160 in FIG. 12, each of other individual control devices 170, 174, 178, 182 also includes the individual interface section 242. The operations of the respective work-element performing apparatuses by the motion commands will be hereinafter explained.

Initially, the main central control device 200 transmits a motion command (i) relating to conveyance of the base member 42 into the manufacture work machine 10. The conveyor 22 which has received the motion command (i) controls the conveyance motor 132 to be operated such that the base member 42 is conveyed to a specific position and thereafter controls the elevating and lowering device 136 to be operated such that the base member 42 is fixed to the specific position. Subsequently, the main central control device 200 transmits a motion command (ii) relating to a movement of the head camera 122 for taking an image of the entirety of the base member 42. The head moving device 30 which has received the motion command (ii) controls the two linear-type moving devices of the planar-type moving device 60 such that the head camera 122 is moved to an image taking position of the base member 42 at which an image of the base member 42 is taken. On this occasion, the up-down-direction moving device 62 is not operated, and the head camera 122 is located at its uppermost position. Subsequently, the main central control device 200 transmits a motion command (iii) relating to image taking of the base member 42. The image taking device 32 which has received the motion command (iii) controls the head camera 122 to turn on its illumination, so as to permit the head camera 122 to take an image of the base member 42. The image taking device 32 processes image data shown in FIG. 14(*a*) obtained by the image taking, so as to obtain positional information of the base member 42 (including the orientation of the base member 42 in the rotational direction). The positional information of the base member 42 obtained by the image taking is transmitted from the image-taking-device controller 190 to the main central control device 200. Subsequent to the motion command (iii), the main central control device 200 transmits a motion command (iv) relating to supplying of the mount components 44. The component supplier 24 which has received the motion command (iv) controls the tray moving device 144 to be operated such that an appropriate one of the component trays 140 is set at a supply position at which the mount components 44 can be supplied.

Subsequently, the main central control device 200 transmits a motion command (v) relating to a movement of the head camera for taking an image of a mounting position of the block 44A as a first component to be mounted. The head moving device 30 which has received the motion command (v) controls the two linear-type moving devices of the planar-type moving device 60 to be operated such that the head camera 122 is moved above mounting position and controls the up-down-direction moving device 62 to be operated such that the head camera 122 is lowered to a height level at which an image of the mounting position can be taken in enlargement. Thereafter, an image of the mounting position of the base member 42 shown in FIG. 14(*a*) is taken according to a motion command (vi), and image data obtained by the image taking is processed so as to obtain positional information of the mounting position (including the rotational position).

Subsequently, the main central control device 200 transmits a motion command (vii) relating to a movement of the dispenser head 28 for performing application of the adhesive as a work to be performed prior to the work of mounting the blocks 44. The head moving device 30 which has received the motion command (vii) controls the dispenser head 28 to be moved above the mounting position of the block 44A as the mount component on the basis of the positional information of the base member 42 received together with the motion command and controls the up-down-direction moving device 64 to be operated such that the dispenser head 28 is lowered to a height level suitable for application of the adhesive to the base member 42. Subsequently, the dispenser head 28 which has received the motion command (viii) relating to the application of the adhesive ejects the adhesive such that the adhesive is applied to the base member 42.

Thereafter, according to a motion command (ix) relating to a movement of the component holding head 26 to a component supply position, the head moving device 30 controls the planar-type moving device 60 to be operated such that the component holding head 26 is moved above the component tray 140, accurately, above the block 44A placed on the tray 140 and controls the up-down-direction moving device 62 to be operated such that the component holding head 26 is lowered to a position at which the component holding head 26 is located above the component tray 140 by a preset distance $L_1$. Subsequently, according to a motion command (x) relating to holding of the component 44A, the component holding head 26 controls the holder moving device 109 to be operated such that the component holder 108 is lowered until the component suction nozzle 50 comes into contact with the block 44A and controls the positive/negative pressure supplier 52 such that the block 44A is held.

When the component holder 108 is lowered by the holder moving device 109 until the component holder 108 comes into contact with the block 44A, it is possible to obtain a height $H_A$ of the block 44A on the basis of: the distance $L_1$ between the component holder 108 and the component tray 140; and the distance by which the component holder 108 is actually lowered. Accordingly, even if the component such as the block 44B has a height dimension different from that of the block 44A, the height dimension of the component is taken into consideration when the component is lowered to the mounting position of the base member 42 and it is possible to control the holder moving device 109 so as to prevent a large load from acting on the component 44 and the base member 42 upon contact of the component 44 with the base member 42.

Subsequently, the main central control device 200 transmits a motion command (xi) relating to a movement of the component holding head 26 for taking an image of the component 44A held by the component holding head 26. According to the motion command (xi), the head moving device 30 controls the component holding head 26 that holds the block 44A to move above the base camera 120. Thereafter, according to a motion command (xii), the image taking of the block 44A by the base camera 120 is performed, so as to obtain positional information of the block 44A relative to the component holding head 26, more specifically, respective positions of the block 44A relative to the component suction nozzle 50 in the front-rear direction and the left-right direction and a rotational position of the block 44A (a rotational angle about an axis extending in the up-down direction).

Figure 14A:
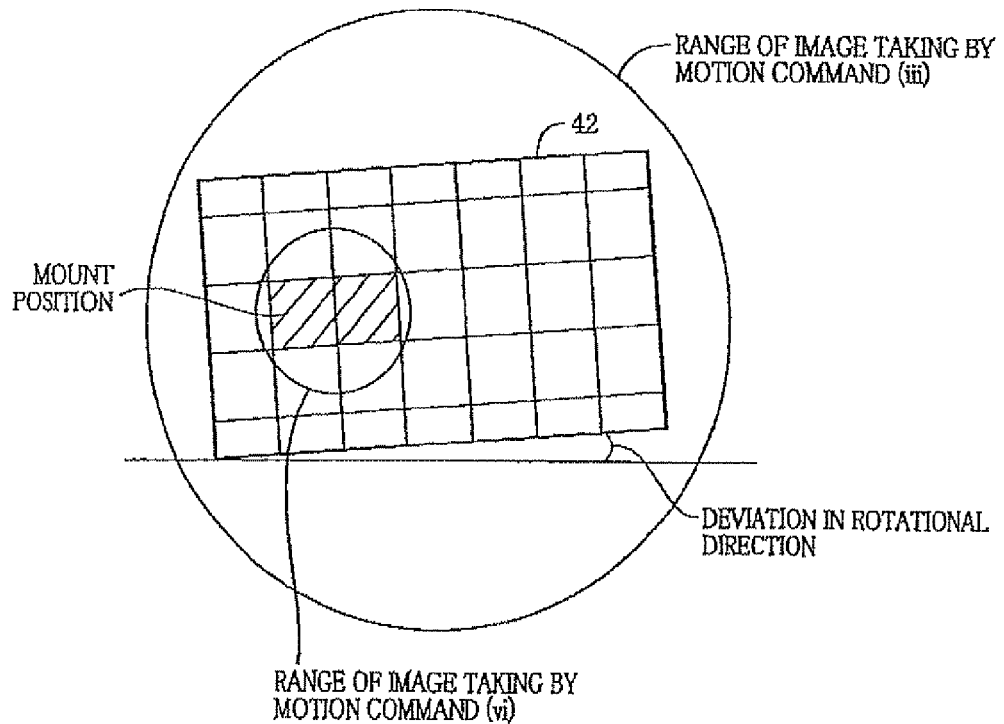
FIG. 14($a$) is a view showing data of an image taken according to a motion command (iii) and 14($b$) is a view showing a distance of a downward movement of a component holder according to a motion command (ix)
Figure 14B:
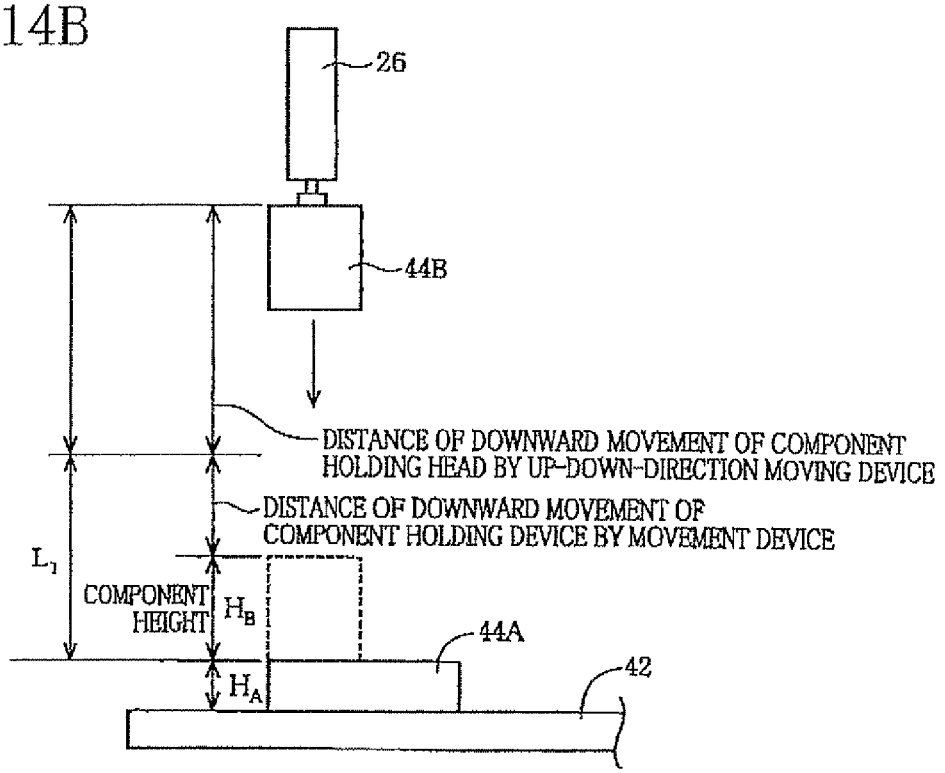

After the image taking performed as described above, according to a motion command (xiii), the head moving device 30 controls the planar-type moving device 60 to be operated such that the component holding head 26 is moved above the mounting position of the component 44 with respect to the base member 42 and controls the up-down-direction moving device 62 to be operated such that the component holding head 26 is lowered to a height position at which the component holding head 26 is located above a mount surface onto which the component is mounted, by the preset distance $L_1$. In FIG. 14(*b*), since the block 44B is the component to be mounted, the upper surface of the block 44A is the mount surface. Where the block 44A which is the component to be first mounted onto the base member 42 is mounted, the upper surface of the base member 42 is the mount surface. Subsequently, according to a motion command (xiv), the component holding head 26 controls the nozzle rotating device to be operated such that the rotational position of the block 44A is adjusted on the basis of the positional information (the rotational position) received together with the motion command (xiv). Thereafter, the component holding head 26 controls the holder moving device 109 to be operated such that the component holder 108 is lowered to a suitable height level on the basis of the height $H_A$ of the block 44A, thereby permitting the block 44A to be bonded to the base member 42. Subsequently, the component holding head 26 controls the positive/negative pressure supplier 52 to be operated such that the block 44A is separated. In this way, mounting of one block 44 is finished. Thereafter, the motion commands similar to the motion commands (x)-(xiv) are repeatedly transmitted, whereby the work of mounting the plurality of blocks 44A, 44B, 44C is repeatedly performed. After all of the blocks 44 are mounted, the assembled article 40 is conveyed by the conveyor 22 out of the manufacture work machine 10.

The manufacture work machine 10 is configured such that the head moving device 30 can move the two work head devices 26, 28 independently of each other in the up-down direction. Therefore, when one of the two work head devices performs the work on the work object having different height portions as shown in FIG. 6, the other of the two work head devices does not become a hindrance to the work performed by the one work head device. Accordingly, the present manufacture work machine 10 is capable of performing various target works on various work objects. That is, the present manufacture work machine 10 ensures enhanced versatility.

<Replacement of Work-Element Performing Apparatus>

Figure 15:
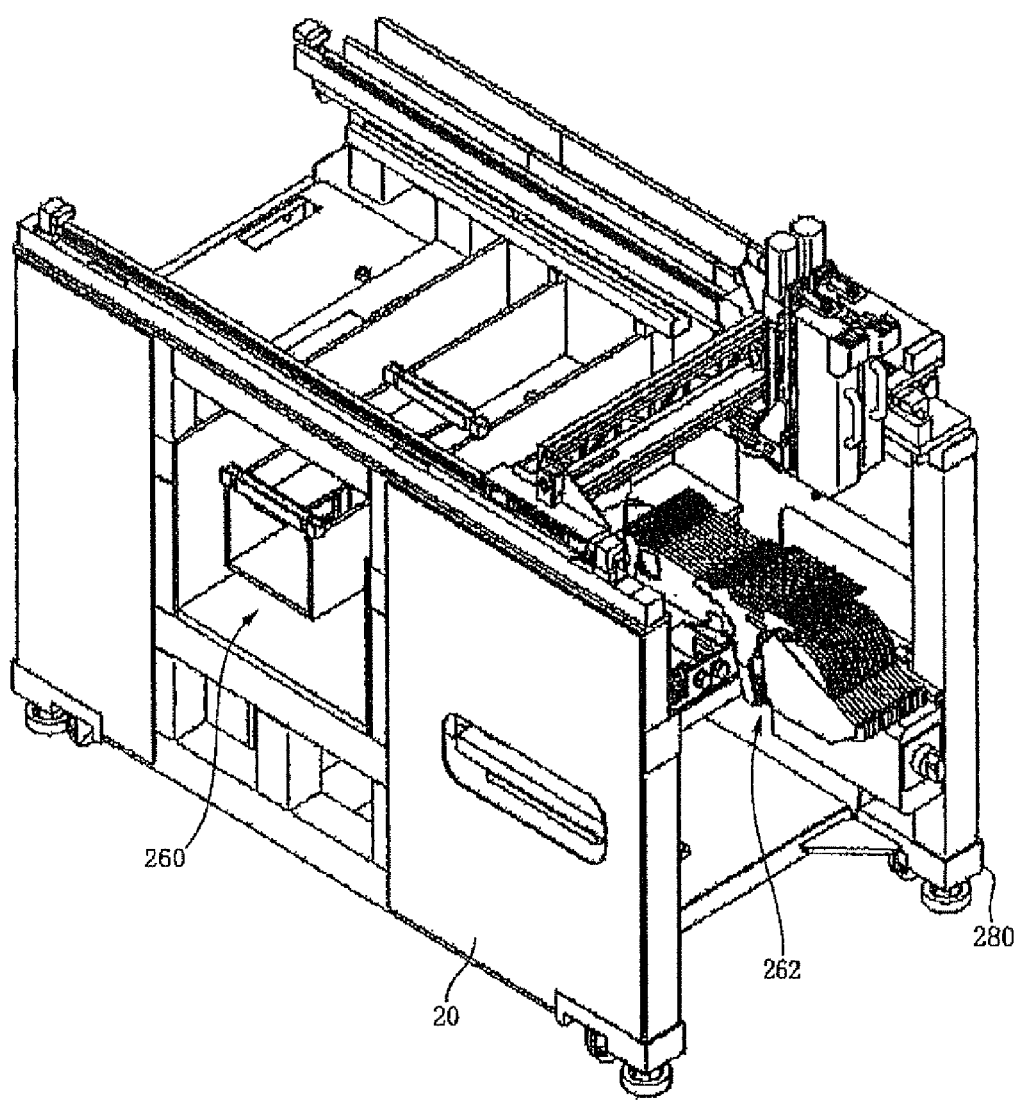
FIG. 15 is a perspective view showing a manufacture work machine in which the conveyor and the component supplier shown in FIG. 4 are replaced with another conveyor and another component supplier, respectively.
Figure 16:
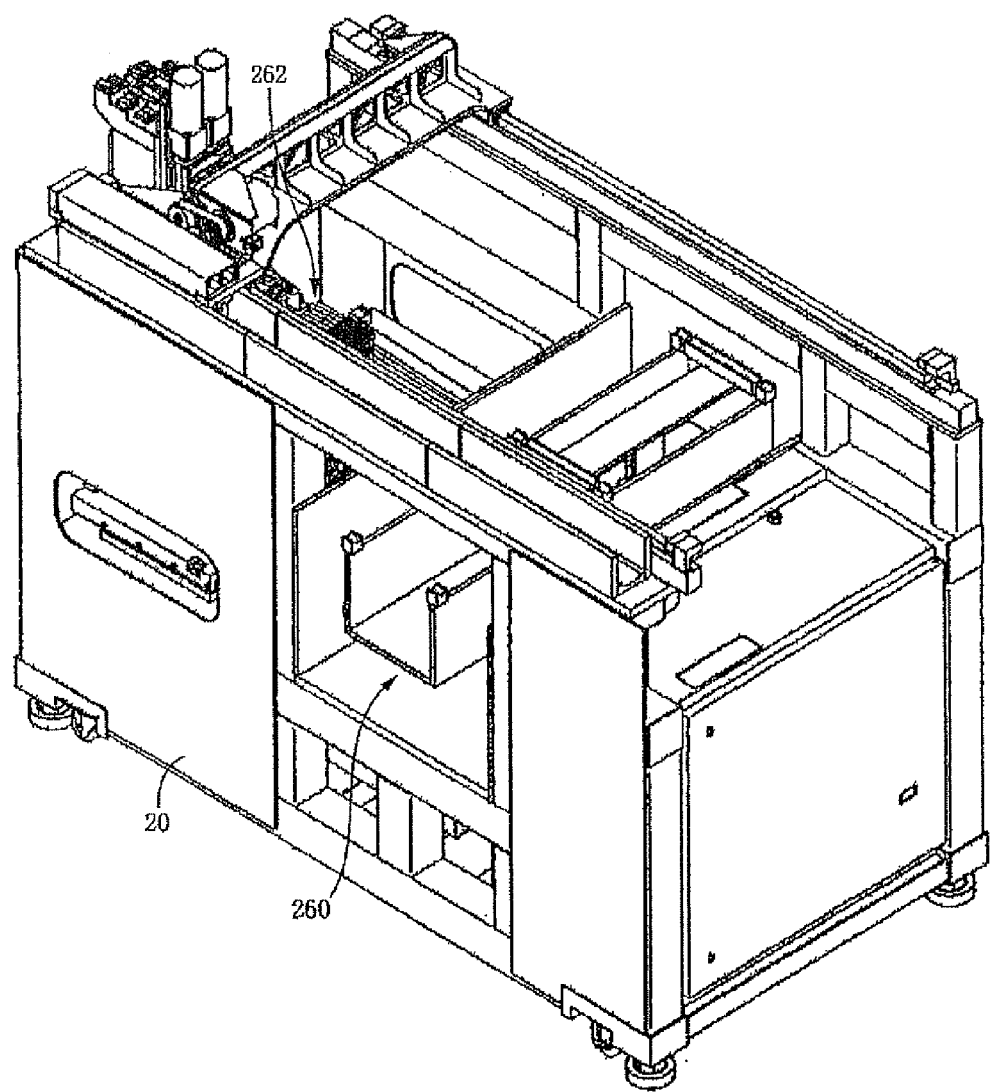
FIG. 16 is a perspective view showing the manufacture work machine as viewed from one side thereof opposite to FIG. 15.
Figure 17:
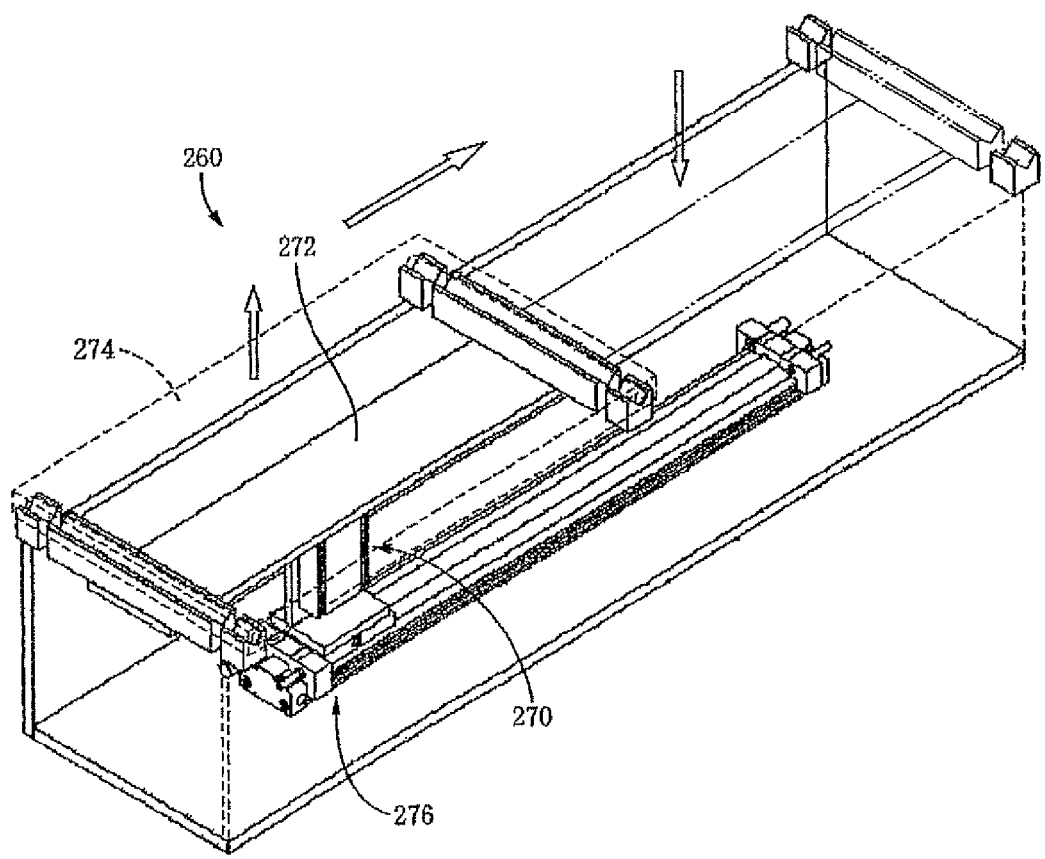
FIG. 17 is an enlargement view of the conveyor shown in FIG. 15.

The manufacture work machine 10 from which the conveyor 22 and the component supplier 24 are detached is shown in FIGS. 2 and 3. The conveyor 22 and the component supplier 24 are attachable to and detachable from the frame 20 with one-touch action. To the respective positions at which the conveyor 22 and the component supplier 24 have been attached, other conveyor and other component supplier can be attached in place of the conveyor 22 and the component supplier 24. FIGS. 15 and 16 show the manufacture work machine 10 in which the conveyor 22 is replaced with a carrier 260 which is a conveyor of a lift and carry type and the component supplier 24 is replaced with tape feeders 262 each of which is a component supplier of a feeder type. FIG. 17 is a perspective view of the carrier 260. While a detailed explanation of the carrier 260 is dispensed with, the carrier 260 is configured such that a holding table 272 is elevated by an elevating and lowering device 270 so as to lift a work (work object) 274 and such that carrying device 276 conveys the thus lifted work object 274 in the conveyance direction. While not illustrated, the frame 20 is formed with protruding portions at respective front-side corners 280 (FIGS. 1 and 15). The protruding portions of the frame 20 is fitted into respective recesses formed in each of the conveyors 22, 260, whereby the conveyor can be attached to the frame 20 without suffering from position deviation with respect to the frame 20.

In place of the conveyor 22, there are attachable other kinds of conveyors such as a double conveyor 282 (FIG. 18) of a module type, a single conveyor, and a conveyor with an elevating and lowering function. In addition, there may be attached a conveyor which is provided, in its inside, with a work-object-lower-portion processing device configured to perform, on the work object located above itself, processing such as laser processing, UV irradiation, blowing of hot air, etc. In place of the component supplier 24, there may be attached a ball feeder, a screw supplier, a stacking unit, etc.

Figure 18:
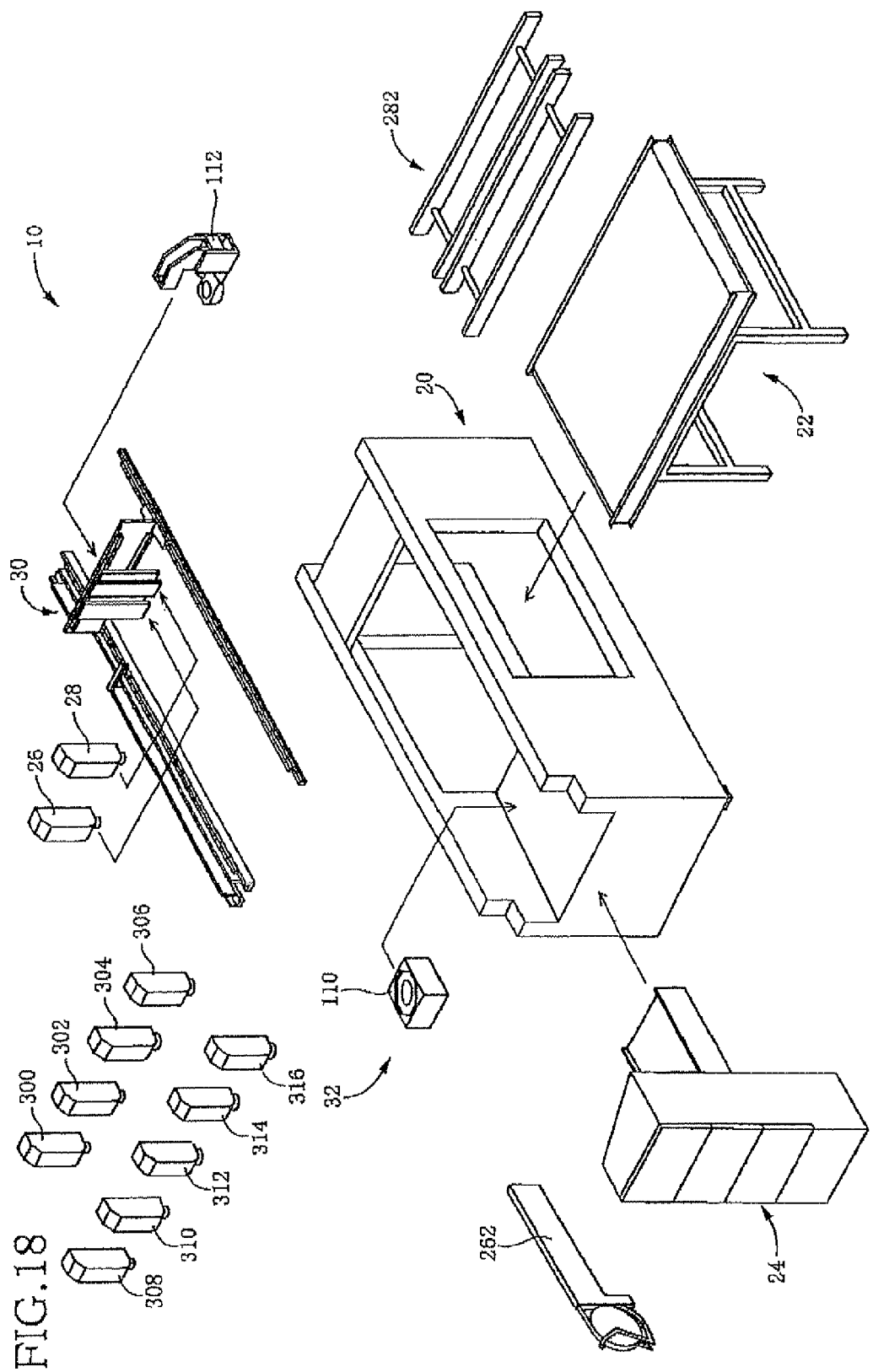
FIG. 18 is a schematic view showing a base of the manufacture work machine of FIG. 1 and a plurality of work-element performing apparatuses in a state in which the apparatuses are detached from the base.

The component holding head 26 and the dispenser head 28 are attachable to and detachable from the sliders 104, 105, as the head holding portion, of the head moving device 30 with one-touch action. To the respective positions at which the component holding head 26 and the dispenser head 28 have been attached, other work head devices can be attached in place of the component holding head 26 and the dispenser head 28. To be more specific, as shown in FIG. 18, there may be attached the following work head devices each as the process head, in place of the dispenser head 28: a high-frequency welder 300 for performing fusion bonding processing by a high-frequency wave on the work object; a laser generator 302 for performing laser processing on the work object; a UV irradiator 304 for performing processing by UV irradiation on the work object; a hot-air blower 306 for performing a heat treatment on the work object by applying hot air; a screw fastener 308 for performing screw fastening processing; a screw attaching/fastening device 310 for performing screw holding and separation and screw fastening processing in a state in which a screw is held; a double dispenser 312 having two dispenser nozzles and configured to perform ejection of two kinds of auxiliary agents; a component holder 314 for performing holding and separation of another component and for performing adjustment of a component hold position by rotating the position at which the component is held; and a solder cream printer 316. In place of the component holding head 26, there may be attached other carry heads such as a component moving head for moving the component in the left-right direction and the front-rear direction, apart from the head moving device 30. In place of the component holding head 26 as the carry head, the process head described above may be attached depending upon the target work of the manufacture work machine.

Accordingly, where there arises a need of manufacturing a new product and it becomes necessary to perform a work for fixing a component by a screw to a work object in place of the mounting work of mounting the component onto the base member, for instance, the target work can be changed not by changing the manufacture work machine per se, but by replacing the component supplier 24 with a component supplier capable of supplying the component to be mounted and the screw and by replacing the dispenser head 28 with the screw attaching/fastening device 310. In the thus structured manufacture work machine, it is possible to press the component utilizing the component holding head 26 as the carry head and to perform, in this state, the screw fastening work by the screw attaching/fastening device 310 as the process head. That is, the present manufacture work machine 10 enables the two work head devices to cooperatively work such that the two work head devices operate as if a human treats one work object with both hands.

In place of the head moving device 30, other kinds of moving devices such as a multiarticular-arm robot-type moving device are attachable. In the present embodiment, the head moving device 30 is configured such that the planar-type moving device moves the two work head devices 26, 28 together. The head moving device 30 may be replaced with another head moving device configured such that the planar-type moving device moves the two work head devices 26, 28 independently of each other. Further, the base camera 120 and the head camera 122 may be replaced with other cameras.

Each of the plurality of work-element performing apparatuses which can be attached in place of the six work-element performing apparatuses including the conveyor 22, the component holding head 26, etc., that constitute the present manufacture work machine 10 has the individual control device having the individual interface section 242 configured to control the operation of itself, like the six work-element performing apparatuses. Even if the work-element performing apparatus of the manufacture work machine 10 is replaced with any of the other work-element performing apparatuses, each of the other work-element performing apparatuses is configured such that the individual control device corresponding to itself can recognize the motion command transmitted from the main central control device 200 and is configured to permit the operating device corresponding to itself to be operated. Accordingly, even if the dispenser head 28 is dispensed with the screw attaching/fastening device 310, for instance, the main central control device 200 may simply change the matter of the motion command and may transmit the changed motion command to the individual control device of the screw attaching/fastening device 280, according to the one protocol described above.

<Manufacture Work System Constituted by a Plurality of Manufacture Work Machines>

In the single manufacture work machine 10, the number of manufacture steps that can be performed is comparatively small. However, a relatively large number of manufacture steps can be performed by constructing a manufacture work system in which the manufacture work machine which is the same as the above-described manufacture work machine 10, or the manufacture work machine in which the work-element performing apparatuses in the above-described manufacture work machine 10 are replaced, etc., is arranged in a plural number and in which the manufacture works by the plurality of manufacture work machines are sequentially performed on a work object while conveying the work object from the upstream-side manufacture work machines toward the downstream-side manufacture work machines. In other words, it is possible to manufacture products or components with a certain degree of complexity. In the present description, there will be explained the thus constructed manufacture work system, more specifically, there will be explained an LED-lamp manufacture system, a power-module manufacture system, and a solar-cell manufacture system.

i) LED-Lamp Manufacturing System

Figure 19:
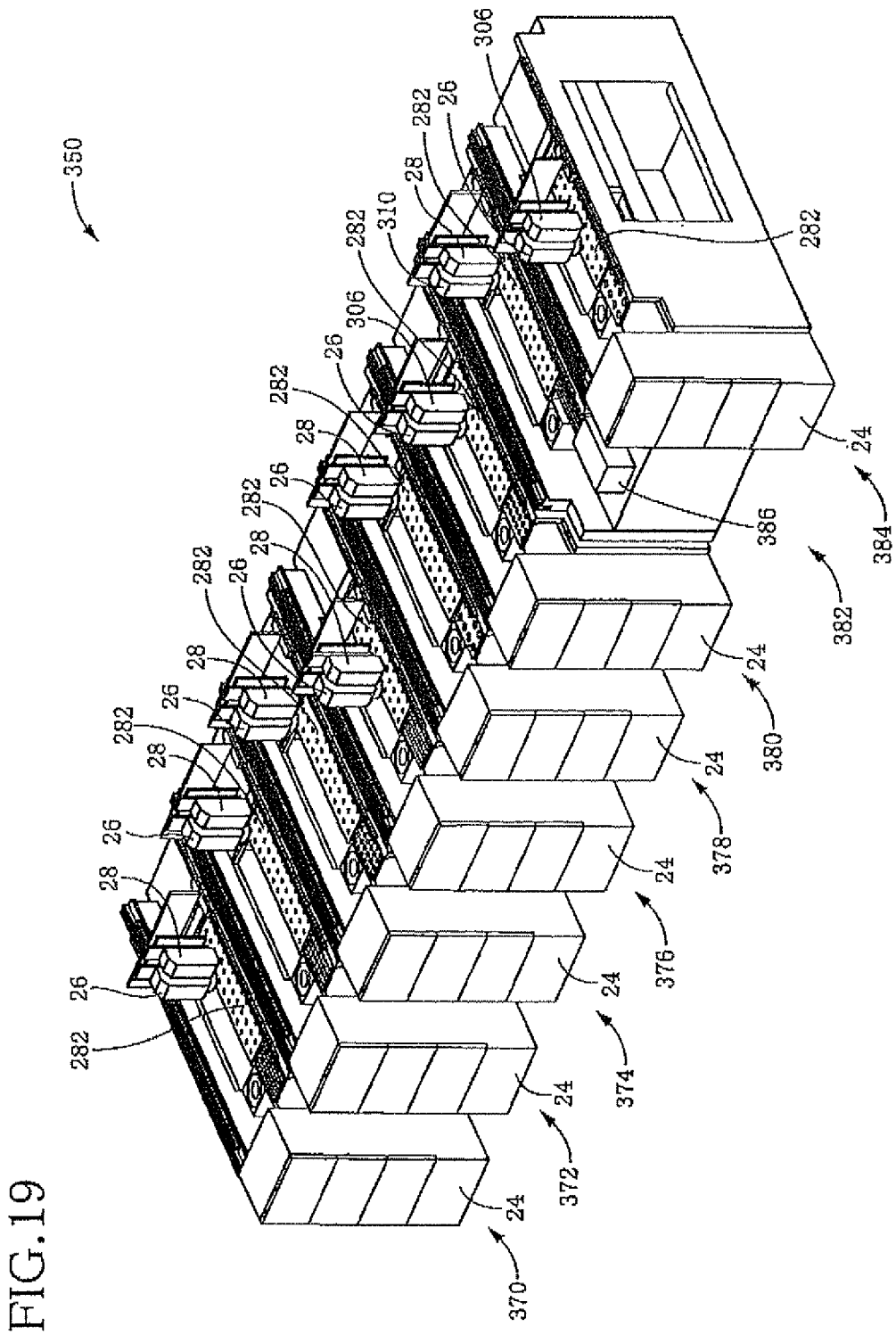
FIG. 19 is a perspective view showing an LED-lamp manufacturing system constituted by a plurality of manufacture work machines.

FIG. 18 is a perspective view of an LED-lamp manufacturing system 350 and FIG. 19 is an exploded view of an LED lamp 352 assembled by the LED-lamp manufacturing system 350. As shown in FIG. 19, the LED lamp 352 includes: a terminal socket 354 having a cylindrical shape with a closed end; a terminal 356 provided in the terminal socket 354; a cylindrical casing 358 fitted onto an upper end of the terminal socket 354; a terminal-attached base member 360 provided in the casing 358; a heat sink 362 fixed to an upper end portion of the casing 358 by an adhesive; a terminal-attached LED board 364 disposed on an upper end face of the heat sink 362; a screw 366 for fixing the LED board 364 to the heat sink 362; and a semi-spherical cover 368 fixed to an upper end portion of the heat sink 362 by an adhesive.

As shown in FIG. 18, the LED-lamp manufacturing system 350 is constituted by eight manufacture work machines. The eight manufacture work machines are a first manufacture work machine 370, a second manufacture work machine 372, a third manufacture work machine 374, a fourth manufacture work machine 376, a fifth manufacture work machine 378, a sixth manufacture work machine 380, a seventh manufacture work machine 382, and an eighth manufacture work machine 384, which are arranged in this order from the upstream side (the left-hand side in FIG. 18). In each of the first manufacture work machine 370, the second manufacture work machine 372, the third manufacture work machine 374, the fourth manufacture work machine 376, and the fifth manufacture work machine 378, the double conveyer 282 of the module type is used in place of the conveyor 22 used in the above-described manufacture work machine 10. In each of the sixth manufacture work machine 380 and the eighth manufacture work machine 384, the double conveyer 282 and the hot-air blower 306 are used in place of the conveyor 22 and the dispenser head 28 of the above-described manufacture work machine 10, respectively. In the seventh manufacture work machine 382, the double conveyer 282, the screw attaching/fastening device 310, and a screw supplier 386 are used in place of the conveyor 22, the component holding head 26, and the component supplier 24 of the above-described manufacture work machine 10, respectively.

The first manufacture work machine 370 includes, each as the work-element performing apparatus, the component holding head 26, the component supplier 24, the double conveyer 282, the head moving device 30, and the image taking device 32 and is configured to perform a manufacture work for placing the terminal socket 354 as a work object on a specific position of the double conveyer 282. (All of the manufacture work machines which will be explained below have the above-described head moving device 30 and image taking device 32 and accordingly an explanation thereof is dispensed with.) In the first manufacture work machine 370, there are sequentially transmitted: a motion command for supplying a tray on which the terminal socket 354 is placed; a motion command for moving the component holding head 26 to a position at which the terminal socket 354 is supplied; a motion command for holding the terminal socket 354 placed on the tray; a motion command for moving the component holding head 26 that holds the terminal socket 354 above the base camera 120; a motion command for taking, by the base camera 120, an image of the terminal socket 354 held by the component holding head 26 and obtaining information of a hold state of the terminal socket 354; a motion command for moving the component holding head 26 to a specific position above the double conveyer 282; a motion command for separating the terminal socket 354 at the specific position on the double conveyer 282; and a motion command for conveying the terminal socket 354 placed on the double conveyer 282. The work-element performing apparatuses 242, etc., perform their work elements in accordance with the corresponding motion commands, whereby the terminal socket 354 placed on the double conveyer 282 is conveyed to the second manufacture work machine 372. Since the motion commands to the image taking device 32, the head moving device 30, and the double conveyer 282 are substantially the same in each of the manufacture work machines, an explanation of those motion commands are dispensed with.

The second manufacture work machine 372 includes, each as the work-element performing apparatus, the component holding head 26, the component supplier 24, and the double conveyor 282 and is configured to perform a manufacture work for mounting the terminal 356 onto the terminal socket 354 as the work object. In the second manufacture work machine 372, there are sequentially transmitted: a motion command for supplying a tray on which the terminal 356 is placed: a motion command for holding the terminal 356 placed on the tray; and a motion command for separating the terminal 356 in the terminal socket 354, whereby the respective work elements are performed, so that the terminal socket 354 onto which the terminal 356 has been mounted is conveyed to the third manufacture work machine 374.

The third manufacture work machine 374 includes, each as the work-element performing apparatus, the component holding head 26, the component supplier 24, and the double conveyor 282 and is configured to perform a manufacture work of mounting the casing 358 into the terminal socket 354 onto which the terminal 356 has been mounted. The fourth manufacture work machine 376 includes, each as the work-element performing apparatus, the component holding head 26, the component supplier 24, and the double conveyor 282 and is configured to perform a manufacture work of mounting the base member 360 into the casing 358. Since the motion commands in each of the third manufacture work machine 374 and the fourth manufacture work machine 376 are similar to the motion commands in the above-described second manufacture work machine 372, an explanation thereof is dispensed with. It is noted that the dispenser head 28 of each of the first manufacture work machine 370, the second manufacture work machine 372, the third manufacture work machine 374, and the fourth manufacture work machine 376 does not operate in the manufacture work of the LED lamp 352.

The fifth manufacture work machine 378 includes, each as the work-element performing apparatus, the component holding head 26, the dispenser head 28, the component supplier 24, and the double conveyor 282 and is configured to perform a manufacture work for fixing the heat sink 362 to the upper end portion of the casing 358 by the adhesive. In the fifth manufacture work machine 378, there are sequentially transmitted: a motion command for applying the adhesive to the upper end portion of the casing 358; a motion command for supplying a tray on which the heat sink 362 is placed; a motion command for holding the heat sink 362 placed on the tray; and a motion command for separating the heat sink 362 at the upper end portion of the casing 358 to which the adhesive has been applied, whereby the respective work elements are performed, so that the LED lamp 352 in which the fixing work of the heat sink 362 by the adhesive has been completed is conveyed to the sixth manufacture work machine 380. That is, in the fifth manufacture work machine 378, the component holding head 26 is a carry head configured to hold the heat sink 362 for mounting and functions as a main head device configured to perform a main work in the work of mounting the heat sink 362. Further, the dispenser head 28 is a process head configured to apply the adhesive and functions as an auxiliary head device configured to perform, prior to the work of mounting the heat sink 362, application of the adhesive as an auxiliary work for the main work.

The sixth manufacture work machine 380 includes, each as the work-element performing apparatus, the component holding head 26, the hot-air blower 306, the component supplier 24, and the double conveyor 282 and is configured to perform a manufacture work for drying the adhesive applied in the fifth manufacture work machine 378 and for placing the LED board 364 onto the upper end face of the heat sink 362. In the sixth manufacture work machine 380, there are sequentially transmitted: a motion command for drying the adhesive by which the casing 358 and the heat sink 362 are bonded; a motion command for supplying a tray on which the LED board 364 is placed; a motion command for holding the LED board 364 placed on the tray; and a motion command for separating the LED board 364 onto the upper end face of the heat sink 362, whereby the respective work elements are performed, so that the LED lamp 352 in which the drying work and the placing work of the LED board 364 have been completed is conveyed to the seventh manufacture work machine 382. That is, in the sixth manufacture work machine 380, the component holding head 26 is a carry head configured to hold the LED board 364 for placing the same 364 on the heat sink 362 and functions as a main head device configured to perform a main work in the work of placing the LED board 364 on the heat sink 362. The hot-air blower 306 is a process head configured to perform drying of the adhesive and functions as an auxiliary head device configured to perform, prior to the work of placing the LED board 364 on the heat sink 362, drying of the adhesive for permitting the heat sink 362 to be sufficiently fixed to the casing 358 as an auxiliary work for the main work.

The seventh manufacture work machine 382 includes the screw attaching/fastening device 310, the dispenser head 28, the screw supplier 386, and the double conveyor 282 and is configured to perform a manufacture work for fixing the LED board 364 to the heat sink 362 by the screw 366 and for applying, to the heat sink 362, the adhesive for fixing the cover 268 to be mounted in the eighth manufacture work machine 384. In the seventh manufacture work machine 382, there are sequentially transmitted: a motion command for supplying the screw 366; a motion command for holding the screw 366 supplied by the screw supplier 386; a motion command for performing screw fastening; a motion command for separating the screw 366; and a motion command for applying the adhesive to the upper end of the heat sink 362, whereby the respective work elements are performed, so that the LED lamp 352 in which the screw fastening work the adhesive application work have been completed is conveyed to the eighth manufacture work machine 384. That is, in the seventh manufacture work machine 382, the screw attaching/fastening device 310 is a process head configured to fasten the LED board 364 to the heat sink 362 by the screw while the dispenser head 28 is a process head configured to perform application of the adhesive.

It is noted that the seventh manufacture work machine 382 may be divided into two manufacture work machines. In this instance, one of the two manufacture work machines may be configured to have, each as the work head device, the component holding head 26 and the screw attaching/fastening device 310 and configured to perform the work of placing the LED board 364 to be performed in the sixth manufacture work machine 380 and the work of fastening the LED board 364 to the heat sink 362. Further, the other of the two manufacture work machines may be configured to have, each as the work head device, the component holding head 26 and the dispenser head 28 and configured to perform the work of applying the adhesive and a work of conveying and fixing the cover to be performed in the eighth manufacture work machine 384. In this arrangement, in the one of the two manufacture work machines, the component holding head 26 is a carry head configured to hold the LED board 364 for mounting and functions as a main head device configured to perform a main work in the work of mounting the LED board 364. The screw attaching/fastening device 310 is a process head configured to perform fastening of the LED board 364 and the heat sink 362 and functions as an auxiliary head device configured to perform the fastening by the screw as an auxiliary work for the main work, after the work of placing the cover 368 to the mount position.

In the manufacture work machine described above, the component holding head 26 may be configured to press the LED board 364 at the mount position when the LED board 364 and the heat sink 362 are fastened by the screw attaching/fastening device 310. Therefore, where it is considered that the main work of the manufacture work machine is the fastening work of the LED board 364 and the heat sink 362, it may be considered that the screw attaching/fastening device 310 as the process head functions as a main head device and the component holding head 26 functions as an auxiliary head device configured to perform an auxiliary work for the fastening work. Accordingly, in the thus configured manufacture work machine, the two work head devices can operate cooperatively.

The eighth manufacture work machine 384 includes the component holding head 26, the hot-air blower 306, the component supplier 24, and the double conveyor 282 and is configured to perform a manufacture work for mounting the cover 368 to the position at which the adhesive has been applied in the seventh manufacture work machine 382 and for drying the adhesive. In the eighth manufacture work machine 384, there are sequentially transmitted: a motion command for supplying a tray on which the cover 368 is placed; a motion command for holding the cover 368 placed on the tray: a motion command for conveying the cover 368 to the position on the heat sink 362 to which the adhesive has been applied; a motion command for drying the adhesive; and a motion command for separating the cover 368, whereby the respective work elements are performed, so that the finished LED lamp 352 is conveyed out of the eighth manufacture work machine 384. That is, in the eighth manufacture work machine 384, the component holding head 26 is a carry head configured to hold the cover 368 for mounting and functions as a main head device configured to perform a main work in the work of mounting the cover 368. The hot-air blower 306 is a process head configured to perform drying of the adhesive and functions as an auxiliary head device configured to perform the drying of the adhesive as an auxiliary work for the main work, after the work of mounting the cover 368. When the hot-air blower 306 performs the drying of the adhesive, the component holding head 26 presses the cover 368 at the mount position. Accordingly, where it is considered that the main work of the eighth manufacture work machine 384 is the drying of the adhesive, it may be considered that the hot-air blower 306 as the process head functions as a main head device and the component holding head 26 functions as an auxiliary head device configured to perform an auxiliary work for the work of drying the adhesive. Accordingly, in the eighth manufacture work machine 384, the two work head devices operate cooperatively.

ii) Power-Module Manufacturing System

Figure 20:
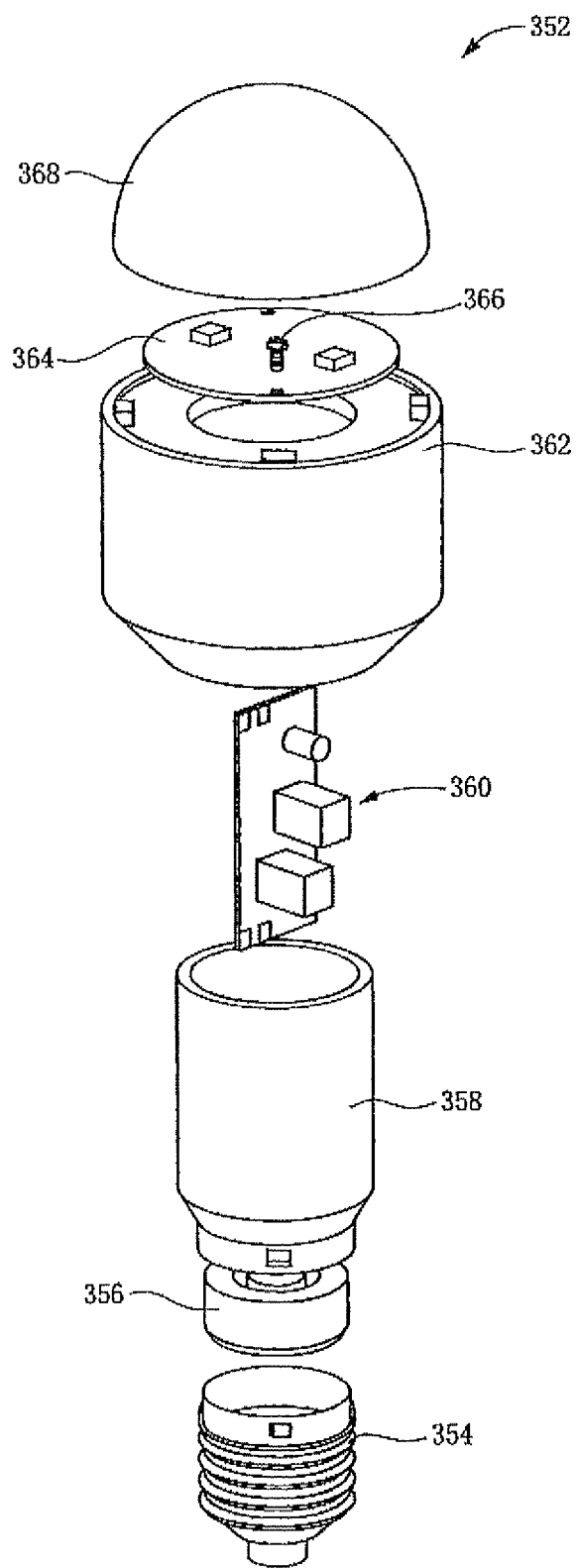
FIG. 20 is an exploded view of an LED lamp manufactured by the LED-lamp manufacturing system of FIG. 19.
Figure 21:
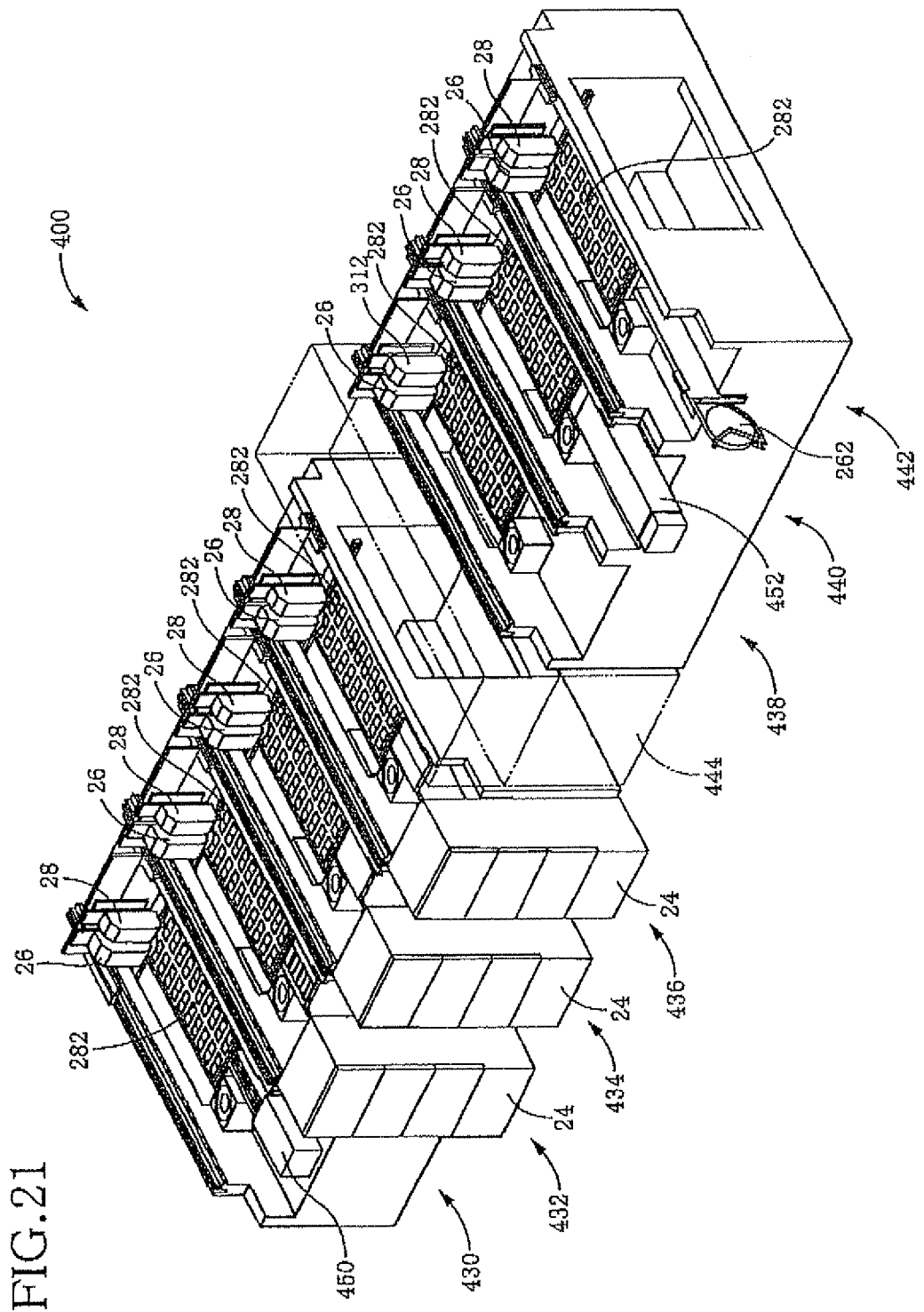
FIG. 21 is a perspective view showing a power-module manufacturing system constituted by a plurality of manufacture work machines.

FIG. 20 is a perspective view of a power-module manufacturing system 400. FIG. 21 is an exploded view of a power module 402 assembled by the power-module assembling system 400. As shown in FIG. 21, the power module 402 is constituted by: a base plate 414; an insulation substrate 416 soldered to the base plate 414; four bushings 418 fitted into respective four holes formed at respective four corners of the base plate 414; a casing 420 fixed onto the base plate 414 by the four bushings 418; a plurality of pin terminals 422 attached to the casing 420; a terminal 424 mounted into the casing 420; a lid 426 covering an upper portion of the casing 420; and a seal 428 attached to a side surface of the casing 420.

As shown in FIG. 20, the power-module manufacturing system 400 is constituted by seven manufacture work machines 430-442 and a wire bonding machine 444. The seven manufacture work machines 430-442 are a first manufacture work machine 430, a second manufacture work machine 432, a third manufacture work machine 434, a fourth manufacture work machine 436, a fifth manufacture work machine 438, a sixth manufacture work machine 440, and a seventh manufacture work machine 442, which are arranged in this order from the upstream side (the left-hand side in FIG. 20). The wire bonding machine 444 which is disposed between the fourth manufacture work machine 436 and the fifth manufacture work machine 438 is not relevant to the present invention and is illustrated by the long dashed double-short dashed line in FIG. 20.

In the first manufacture work machine 430, the double conveyer 282 of the module type and a bushing supplier 450 for supplying the bushings 418 are used in place of the conveyor 22 and the component supplier 24 of the manufacture work machine 10, respectively. In each of the second manufacture work machine 432, the third manufacture work machine 434, and the fourth manufacture work machine 436, the double conveyer 282 is used in place of the conveyor 22' of the manufacture work machine 10. In the fifth manufacture work machine 438, the double conveyer 282 and the double dispenser 312 are used in place of the conveyor 22 and the dispenser head 28 of the manufacture work machine 10, respectively, and the component supplier 24 used in the manufacture work machine 10 is detached. In the sixth manufacture work machine 440, the double conveyer 282 and a lid supplier 452 for supplying the lid 426 are used in place of the conveyor 22 and the component supplier 24 of the manufacture work machine 10, respectively. In the seventh manufacture work machine 442, the double conveyer 282 and the tape feeders 262 are used in place of the conveyor 22 and the component supplier 24 of the manufacture work machine 10, respectively.

In the power-module manufacturing system 400, the insulation substrate 416 is soldered to the base plate 414 in advance, and the base plate 414 to which the insulation substrate 416 is attached is fed into the first manufacture work machine 430 as a work object. The first manufacture work machine 430 is configured to perform a manufacture work for mounting the four bushings 418 into the respective four corners of the base plate 414 to which the insulation substrate 416 is attached. The second manufacture work machine 432 is configured to perform a manufacture work for mounting the casing 420 onto the base plate 414 such that the four bushings 418 are fitted into the respective four holes formed at the four corners of the casing 420. The third manufacture work machine 434 is configured to perform a manufacture work for attaching the plurality of pin terminals 422 into the casing 420. The fourth manufacture work machine 436 is configured to perform a manufacture work for mounting the terminal 424 into the casing 420. When the manufacture work by the fourth manufacture work machine 436 is completed, the wire bonding machine 444 performs wire bonding processing. The power module 402 which has been subjected to the wire bonding processing is fed into the fifth manufacture work machine 438. The fifth manufacture work machine 438 is configured to perform a manufacture work for ejecting two kinds of auxiliary agents, i.e., silicone gel and epoxy resin, into the casing 420. The sixth manufacture work machine 440 is configured to perform a manufacture work for mounting the lid 426 onto the upper portion of the casing 420. The seventh manufacture work machine 442 is configured to perform a manufacture work for attaching the seal 428 to the side surface of the casing 420. When the manufacture work by the seventh manufacture work machine 442 is completed, the finished power module 402 is conveyed out of the seventh manufacture work machine 442. Since the motion commands in the manufacture work machines 430-442 of the present system 400 are similar to the motion commands in the manufacture work machines 370-384 of the above-described LED-lamp manufacturing system 350, an explanation relating to the motion commands in the present system 400 is dispensed with.

iii Solar-Cell Manufacturing System

Figure 22:
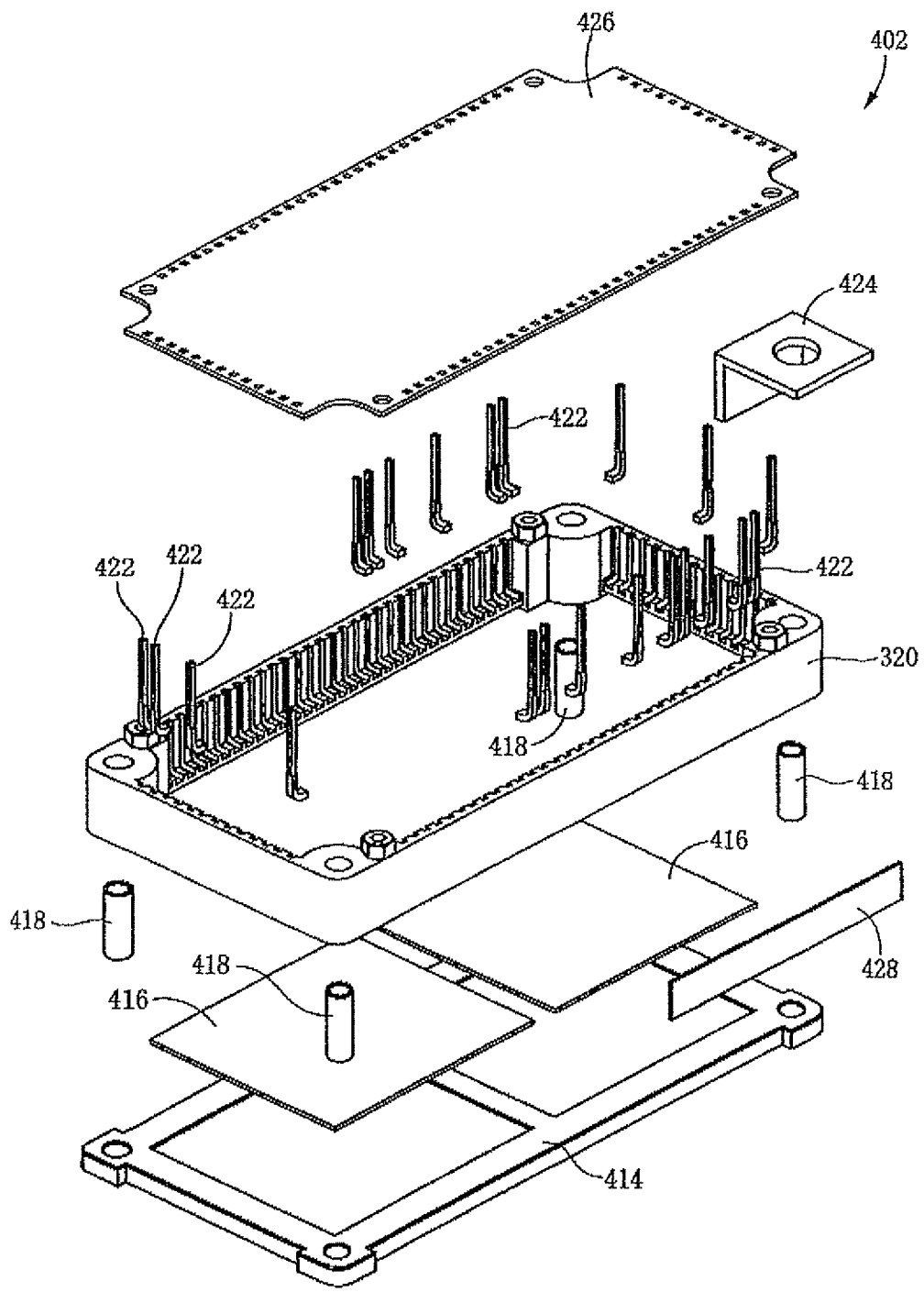
FIG. 22 is an exploded view of a power module manufactured by the power-module manufacturing system of FIG. 21.
Figure 23:
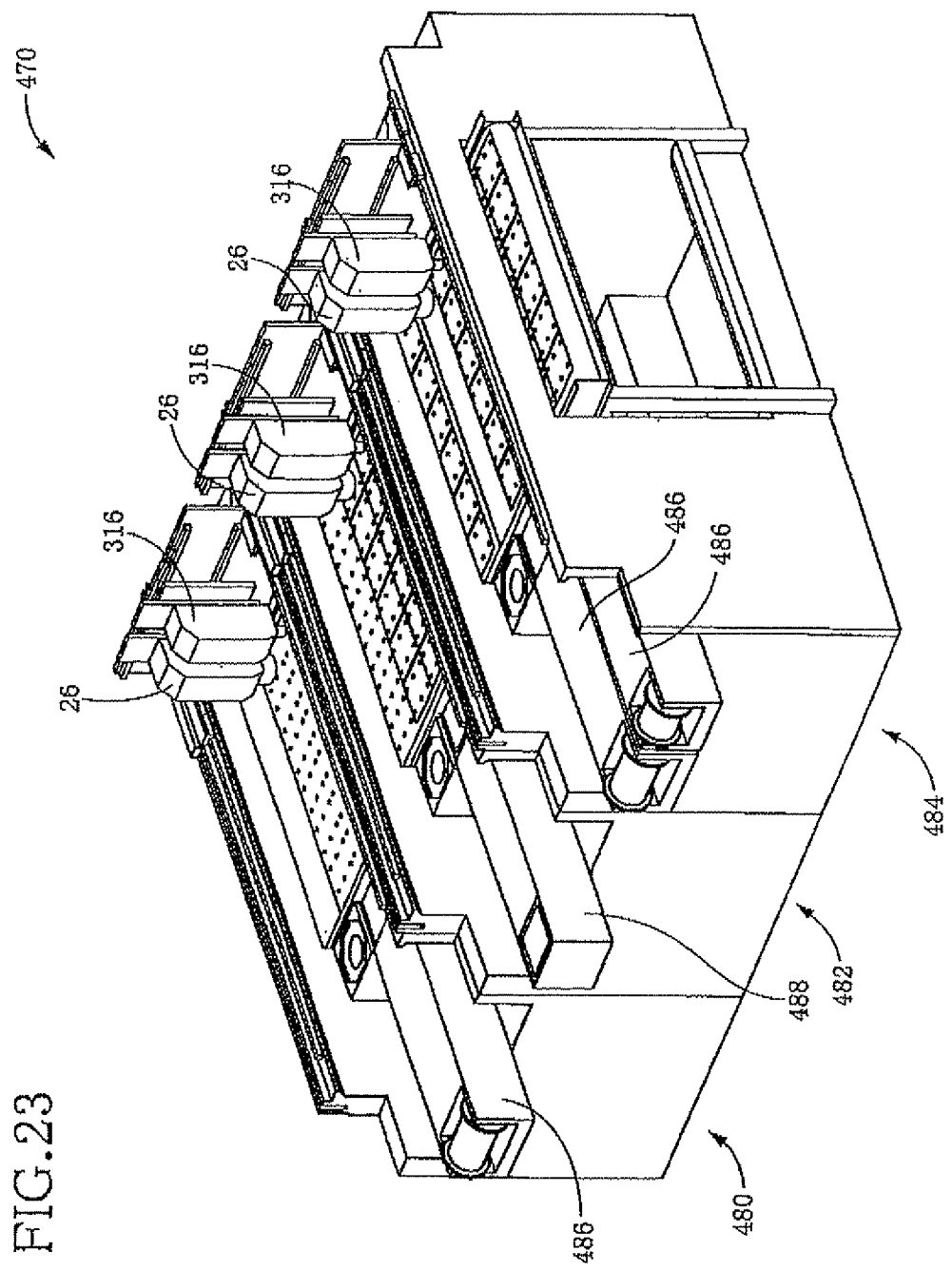
FIG. 23 is a perspective view showing a solar-cell manufacturing system constituted by a plurality of manufacture work machines.
Figure 24:
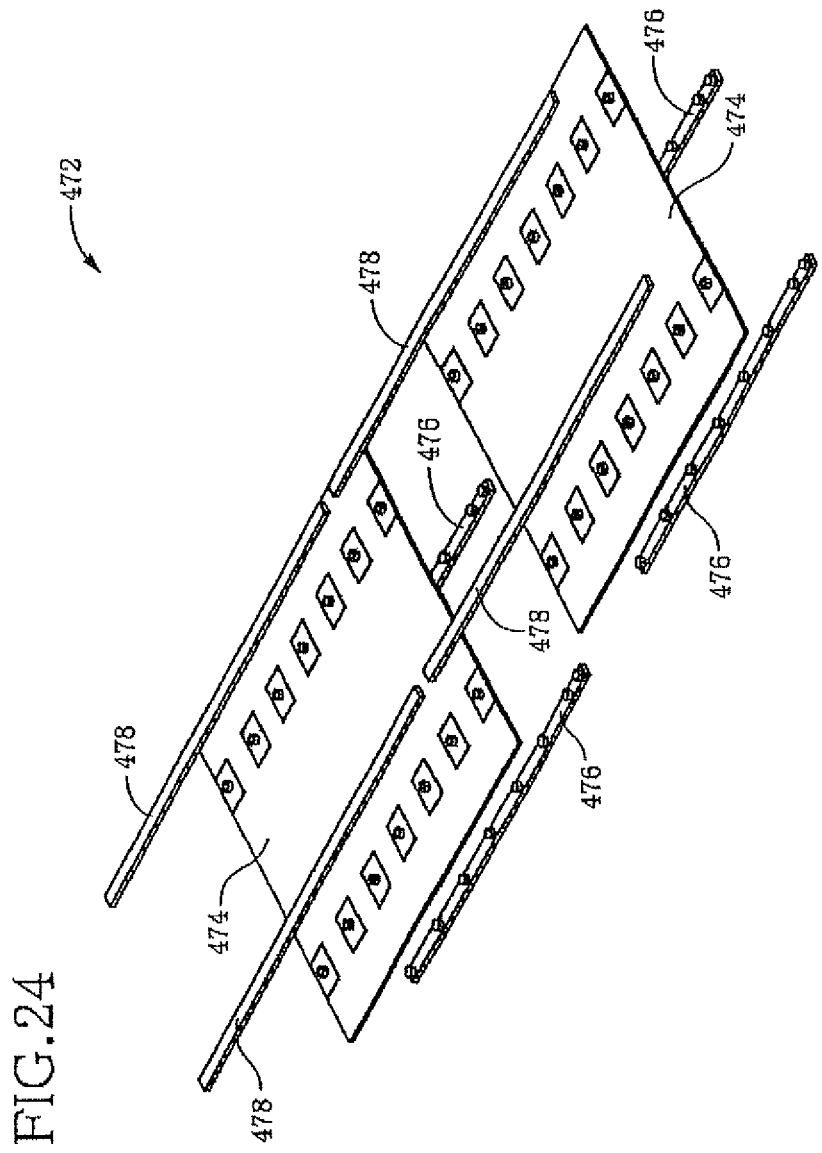
FIG. 24 is an exploded view of a solar cell manufactured by the solar-cell manufacturing system of FIG. 23.

FIG. 22 is a perspective view of a solar-cell manufacturing system 470. FIG. 23 is an exploded view of a solar cell 472 manufactured by the solar-cell manufacturing system 470. As shown in FIG. 23, the solar cell 472 is constituted by: a silicon cell 474; lower interconnectors 476 soldered to a lower surface of the silicon cell 474; and upper interconnectors 478 soldered to an upper surface of the silicon cell 474. The solar-cell manufacturing system 470 is constituted by three manufacture work machines, as shown in FIG. 22. The three manufacture work machines are a first manufacture work machine 480, a second manufacture work machine 482, and a third manufacture work machine 484, which are arranged in this order from the upstream side (the left-hand side in FIG. 22). In the first manufacture work machine 480, the solder cream printer 316 and an interconnector supplier 486 for supplying an interconnector are used in place of the dispenser head 28 and the component supplier 24 of the manufacture work machine 10, respectively. In the second manufacture work machine 482, the solder cream printer 316 and a silicon-cell supplier 488 for supplying the silicon cell 474 are used in place of the dispenser head 28 and the component supplier 24 of the manufacture work machine 10, respectively. In the third manufacture work machine 484, the solder cream printer 316 is used in place of the dispenser head 28 of the manufacture work machine 10, and two interconnector suppliers 486 are used in place of the component supplier 24 of the manufacture work machine 10.

The first manufacture work machine 480 includes, each as the work-element performing apparatus, the component holding head 26, the solder cream printer 316, the interconnector supplier 486, and the conveyor 22 and is configured to perform a manufacture work for placing the lower interconnectors 376, each as a work object, to respective specific positions on the conveyor belt 50 of the mounter 26 and for printing solder cream on all portions on the upper surface of each lower interconnector 376 to which the solder cream should be applied. The second manufacture work machine 482 includes, each as the work-element performing apparatus, the component holding head 26, the solder cream printer 316, the silicon-cell supplier 488, and the conveyor 22 and is configured to perform a manufacture work for mounting the silicon cell 474 on the lower interconnectors 476 to which the solder cream has been printed and for printing the solder cream on a part of portions of the upper surface of the silicon cell 474 on which the solder cream should be printed. The third manufacture work machine 484 includes, each as the work-element performing apparatus, the component holding head 26, the solder cream printer 316, two interconnector suppliers 486, and the conveyor 22 and is configured to perform a manufacture work for printing the solder cream on the rest of the portions of the upper surface of the silicon cell 474 on which the solder cream should be printed and for mounting the upper interconnectors 478 onto the portions on the silicon cell 474 on which the solder cream has been printed. When the manufacture work by the third manufacture work machine 484 is completed, the produced solar cell 472 is conveyed out of the third manufacture work machine 484. In the present system 470, each of the three manufacture work machines 480, 482, 484 includes the component holding head 26 and the solder cream printer 316 as two work head devices. In each of the three manufacture work machines 480, 482, 484, the component holding head 26 is a carry head configured to hold the supplied component for mounting and functions as a main head device configured to perform a main work in the work of mounting the component. The solder cream printer 316 is a process head configured to perform application of the solder cream and functions as an auxiliary head device configured to perform, prior to the work of mounting the component, application of the solder cream as an auxiliary work for the main work. Since the motion commands in the manufacture work machines 480-484 in the present system 470 are similar to the motion commands in the manufacture work machines 370-384 in the above-described LED-lamp manufacturing system 350, an explanation relating to the motion commands in the present solar-cell manufacturing system 470 is dispensed with.

iv) Other Characteristics in Manufacture Work System

Figure 25:
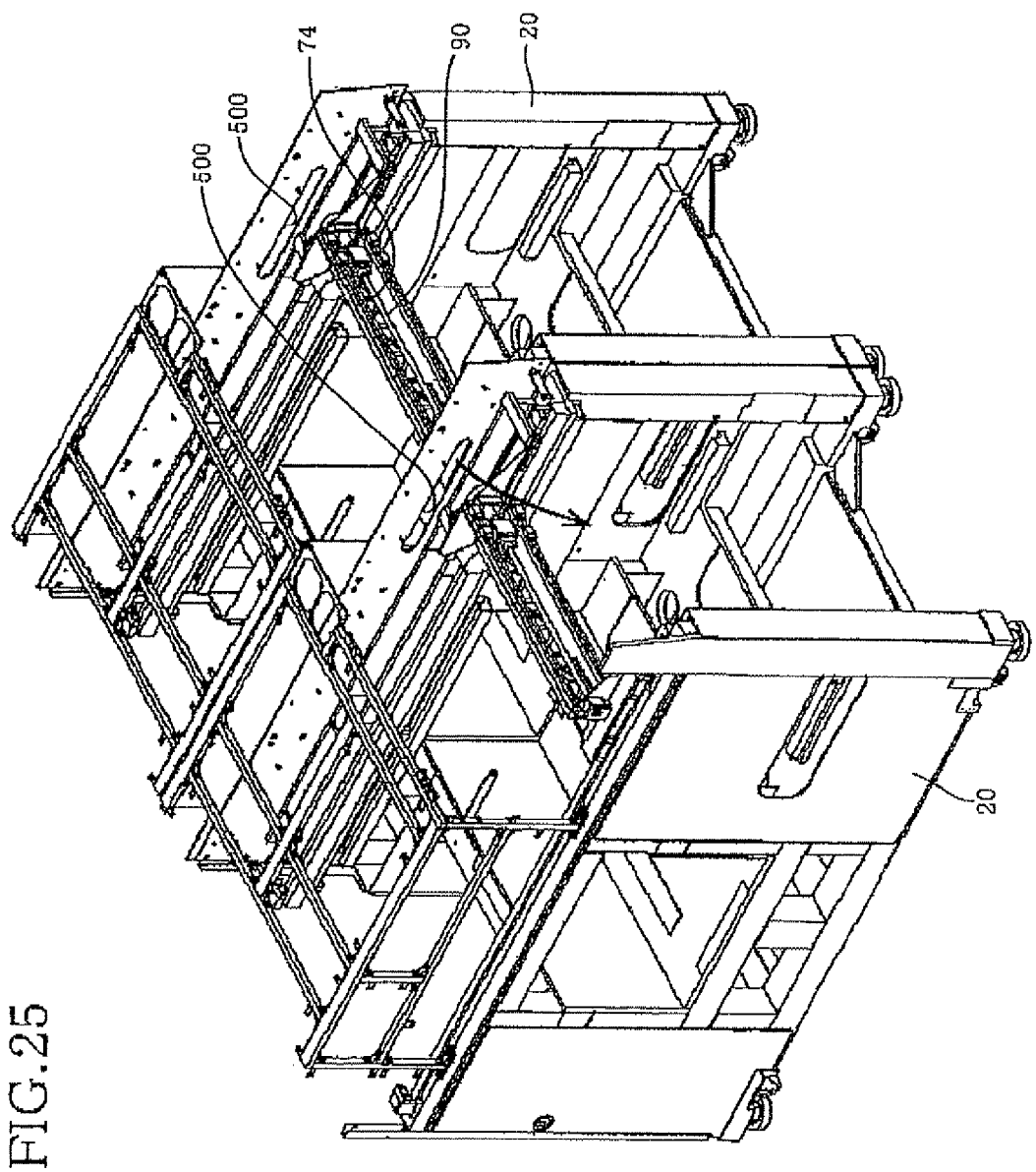
FIG. 25 is a view showing a manner of inserting and retracting a rod member of a head moving device of each of the plurality of manufacture work machines in each of the manufacturing systems of FIGS. 19, 21, and 23.

FIG. 25 shows only two manufacture work machines in a manufacture work system. As shown in FIG. 25, the frame 20 of each manufacture work machine is formed with an opening 500. The opening 500 formed in the frame 20 of each manufacture work machine is located at a position at which the opening 500 is opposed to one end portion of the screw rod 90 disposed on the beam 74 of the manufacture work machine adjacent thereto, in a state in which the beam 74 is located at the most frontward position as shown in FIG. 25. Where the screw rod 90 is replaced due to some failure, the screw rod 90 can be retracted and inserted through the opening 500 formed in the frame 20 of the adjacent manufacture work machine. That is, even in an instance where the screw rod 90 is replaced, the manufacture work machine per se need not be detached from the system, enabling the screw rod 90 to be easily replaced.

REFERENCE SIGNS LIST

10: assembling work machine (manufacture work machine) 12,14: cover (external panel) 20: frame (base) 22: conveyor 24: component supplier 26: component holding head (main head device, first work head device) 28: dispenser head device (auxiliary head device, second work head device) 30: head moving device 32: image taking device 40: base member (first component) 44: electronic circuit component (second component) 50: suction nozzle 52: positive/negative pressure supplier (operating device) 54: dispenser nozzle 58: ejection device (operating device) 60: planar-type moving device 62,64: up-down-direction moving device (Z-direction moving device, operating device) 66: X-direction moving device (linear-type moving device, operating device) 68: Y-direction moving device (linear-type moving device, operating device) 82: linear motor 90: screw rod (rod member) 94: electromagnetic motor 100,101: ball screw mechanism 102, 103: electromagnetic motor 104,105: slider (head holding portion) 106: opening 108: component holder (main device) 109: holder moving device (movement device, operating device) 114: electromagnetic motor 118: electromagnetic motor 119: nozzle rotating device (operating device) 120: base camera 122: head camera 128: belt rotating device (operating device) 130: conveyor belt 132: conveyance motor 136: elevating and lowering device (operating device) 144: try moving device (operating device) 160: moving-device control device (individual control device) 170: component-holding-head control device (individual control device) 174: dispenser-head control device (individual control device) 178: supplier control device (individual control device) 182: conveyor control device (individual control device) 190: image-taking-device controller (individual control device) 192: sub central control device 200: main central control device 240: central interface section 242: individual interface section 260: lift and carry (conveyor) 262: tape feeder (component supplier) 282: double conveyor 300: high-frequency welder 302: laser generator 304: UV irradiator 306: hot-air blower 308: screw fastener 310: screw attaching/fastening device 312: double dispenser 314: component holder 316: solder cream printer 350: LED-lamp manufacturing system (manufacture work system) 370,372,374,376,378,380,382,384: manufacture work machine 386: screw supplier 400: power-module manufacturing system (manufacture work system) 430,432, 434,436,438,440,442: manufacture work machine 450: bushing supplier 452: lid supplier 470: solar-cell manufacturing system (manufacture work system) 480,482,484: manufacture work machine 500: opening

The invention claimed is:

1. A manufacture work machine for performing a manufacture work, comprising:
 a plurality of work-element performing apparatuses each configured to perform one of a plurality of work elements that comprise the manufacture work, wherein
 the plurality of work-element performing apparatuses include:
  a plurality of work head devices comprising a first work head device and a second work head device which are mutually different in a kind of a work to be performed; and
  a head moving device configured to move the plurality of work head devices,
 the head moving device includes a planar-type moving device configured to move the plurality of work head devices as a unit along one plane and configured not to move the plurality of work head devices independently of each other along the one plane,
 the manufacture work machine is an assembling work machine configured to perform, as the manufacture work, an assembling work of assembling a plurality of components into an assembled article and which is configured to perform, as at least a part of the assembling work, a work of mounting, onto a first component as one of the plurality of components, a second component as another one of the plurality of components,
 the first work head device is configured to perform holding of the second component, as a work necessary for mounting the second component onto the first component,
 the head moving device includes a plurality of up-down-direction moving devices configured to move the plurality of work head devices independently of each other in an up-down direction,
 the head moving device includes a plurality of head holding portions for respectively holding the plurality of work head devices, the up-down-direction moving devices are configured to move the plurality of work head devices in the up-down direction by respectively moving the head holding portions, and the manufacture work machine further comprises an image taking device attached to one of the head holding portions that holds the first work head device, the image taking device being configured to be moved, in the up-down direction, by one of the plurality of up-down-direction moving devices that moves the first work head device, such that the image taking device is moved together with the first work head device.

2. The manufacture work machine according to claim 1,
wherein the second work head device is configured to perform one of (A) a work to be performed prior to a work of mounting the second component onto the first component, as the work necessary for mounting the second component onto the first component; and (B) a work to be performed on an article in which the second component has been mounted onto the first component.

3. The manufacture work machine according to claim 2,
wherein the plurality of work-element performing apparatuses include a component supplier configured to perform, as one of the plurality of work elements, supplying of the second component, and
wherein the second work head device is moved together with the first work head device by the planar-type moving device when the first work head device is moved by the planar-type moving device to the component supplier for holding the second component.

4. The manufacture work machine according to claim 1, wherein at least one of the plurality of work head devices is configured to be exchangeable with another work head device.

5. The manufacture work machine according to claim 1, wherein the one of the plurality of work head devices includes: a main device functioning as a main working element in a work to be performed by the one of the plurality of work head devices; and a movement device held by the head holding portion and configured to move the main device in the up-down direction relative to the head holding portion.

6. The manufacture work machine according to claim 1,
wherein the image taking device is configured to take an image of at least one of the first component and an article in which the second component has been mounted onto the first component.

7. The manufacture work machine according to claim 1,
wherein the plurality of work-element performing apparatuses include: a conveyor configured to perform, as one of the plurality of work elements, conveyance of at least one of the first component and the assembled article; and a component supplier configured to perform, as one of the plurality of work elements, supplying of the second component.

* * * * *